(12) United States Patent
Kuroda et al.

(10) Patent No.: US 6,506,647 B2
(45) Date of Patent: Jan. 14, 2003

(54) METHOD FOR FABRICATING A SEMICONDUCTOR INTEGRATED CIRCUIT DEVICE

(75) Inventors: Kenichi Kuroda, Tachikawa (JP); Kozo Watanabe, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/961,059

(22) Filed: Sep. 24, 2001

(65) Prior Publication Data

US 2002/0042172 A1 Apr. 11, 2002

(30) Foreign Application Priority Data

Oct. 11, 2000 (JP) .......................................... 2000-310256

(51) Int. Cl.[7] .......................................... H01L 21/8234
(52) U.S. Cl. ........................ 438/275; 438/197; 438/239; 438/241; 438/258
(58) Field of Search .................................. 438/275, 241, 438/258, 197, 264, 239

(56) References Cited

U.S. PATENT DOCUMENTS 6,069,038 A    5/2000  Hashimoto et al.
6,133,096 A  * 10/2000  Su et al. ....................... 438/264
6,284,592 B1 *  9/2001  Lee ............................. 438/241

FOREIGN PATENT DOCUMENTS

JP     2000-91535      9/1998
WO    WO9850951        5/1997

* cited by examiner

Primary Examiner—David Nelms
Assistant Examiner—Thao P Le

(57) ABSTRACT

A method for fabricating a semiconductor integrated circuit device including a memory cell of a MISFET and a capacitor element formed in a memory cell-forming region of a semiconductor substrate, and an n channel-type MISFET and a p channel-type MISFET in a peripheral circuit-forming region, including: forming a gate insulating film on a semiconductor substrate; forming a polysilicon film and a high melting metal film on the gate insulating film, patterning to form a gate electrode in a memory cell-forming region and in a peripheral circuit-forming region, respectively; removing the high melting metal film from the gate electrode of the peripheral circuit-forming region; and depositing a metal layer over the peripheral circuit-forming region, followed by thermal treatment to form a silicide film on the polysilicon film in the gate electrode and a high concentration diffusion layer of the peripheral circuit-forming region.

9 Claims, 18 Drawing Sheets

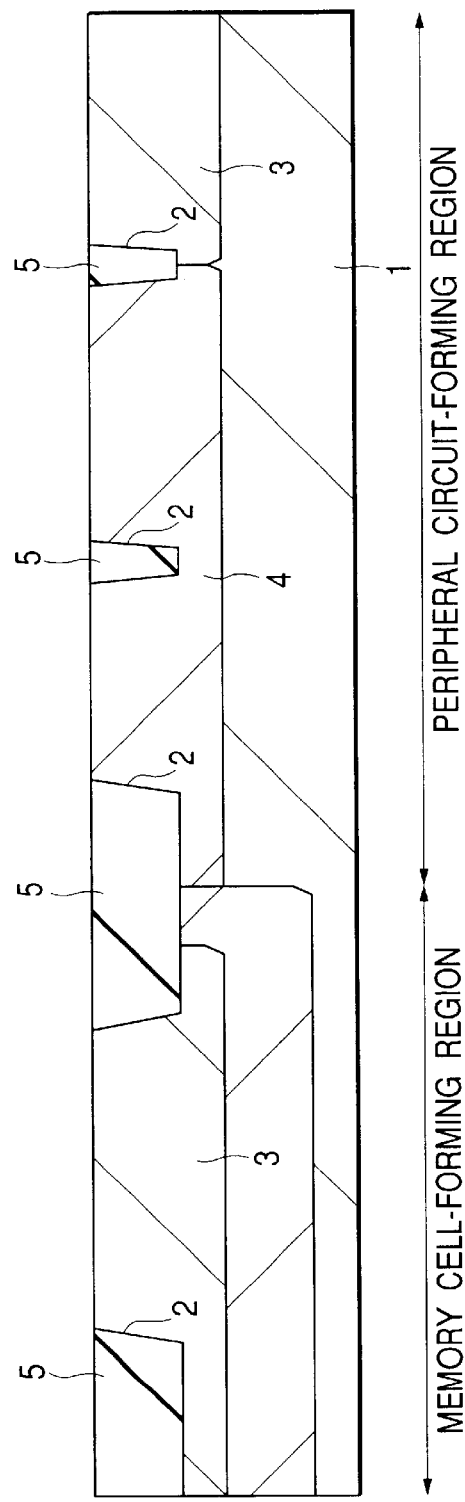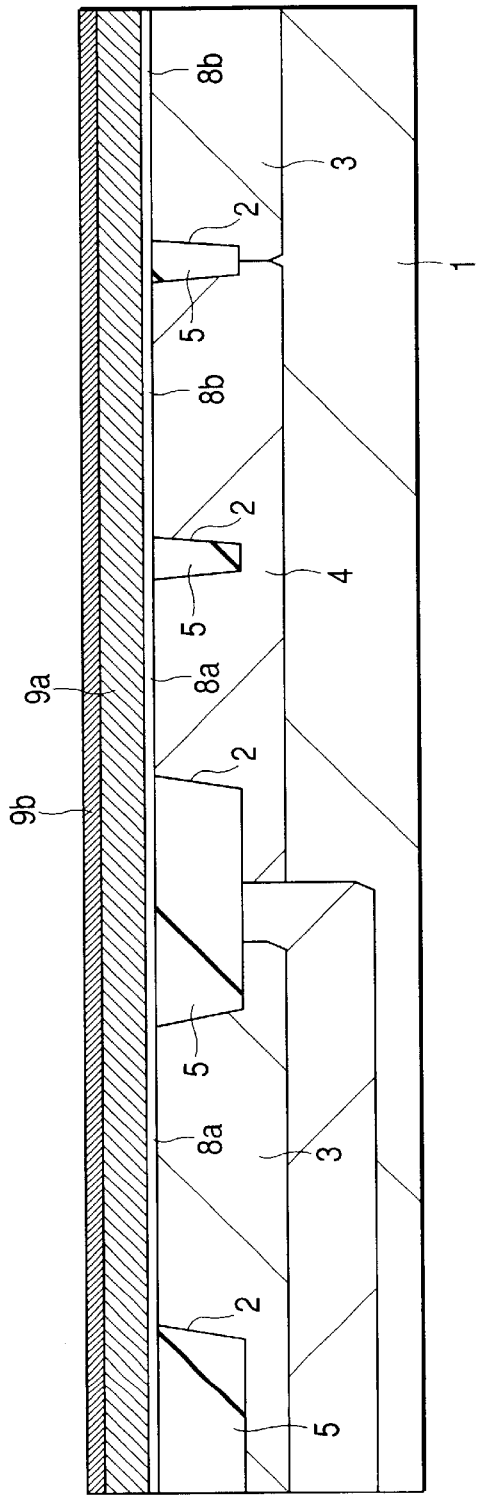

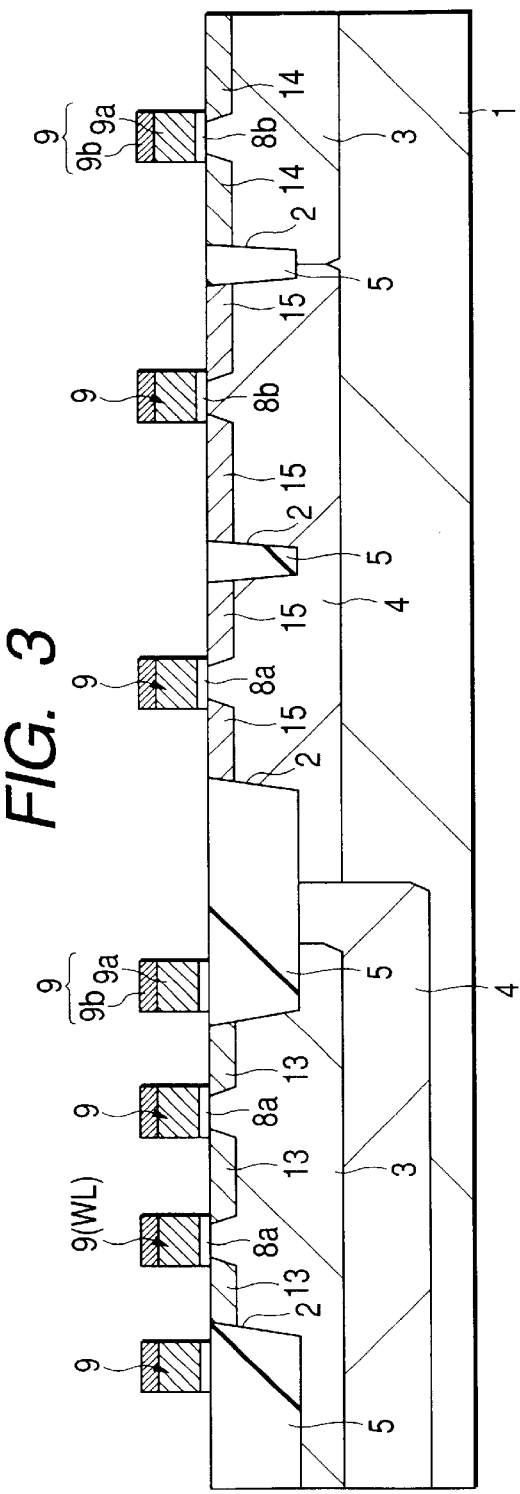
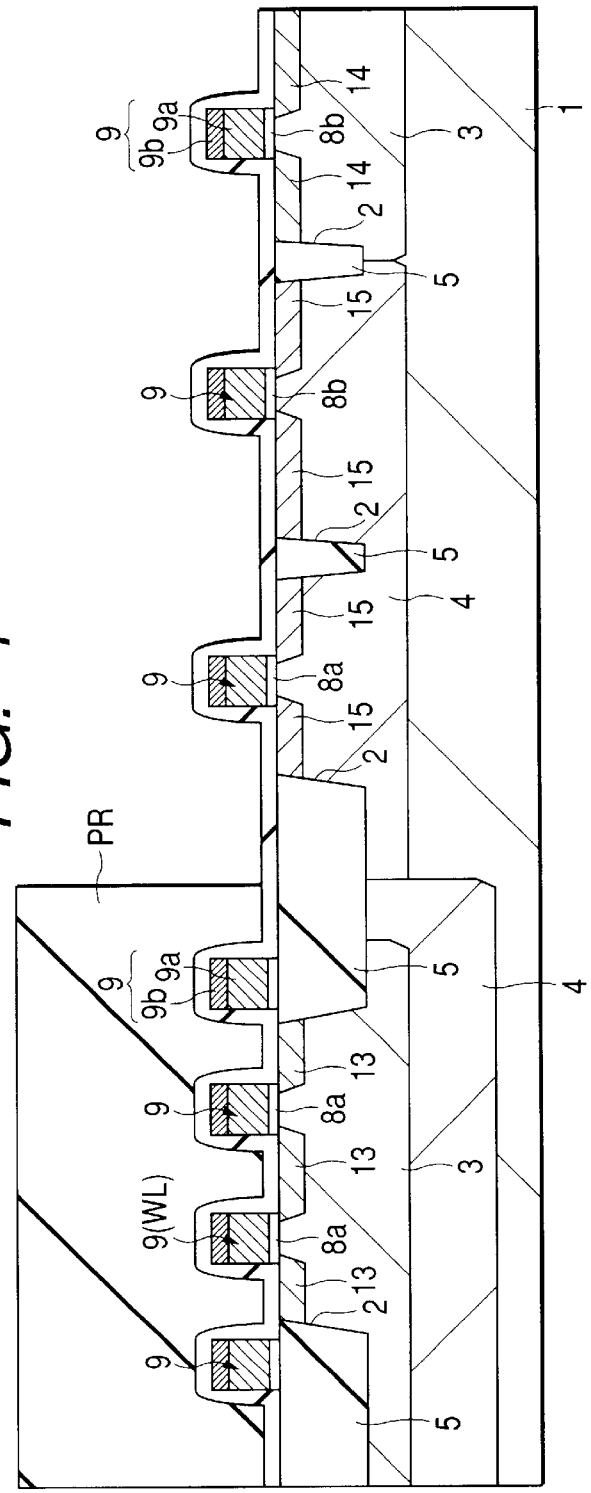

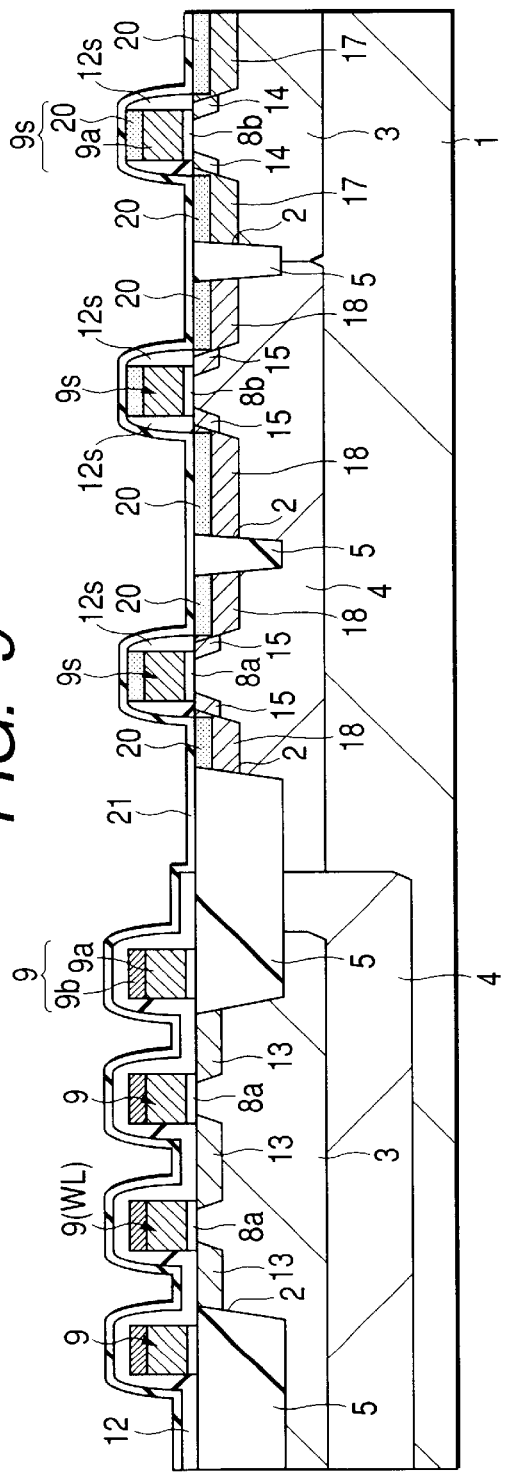
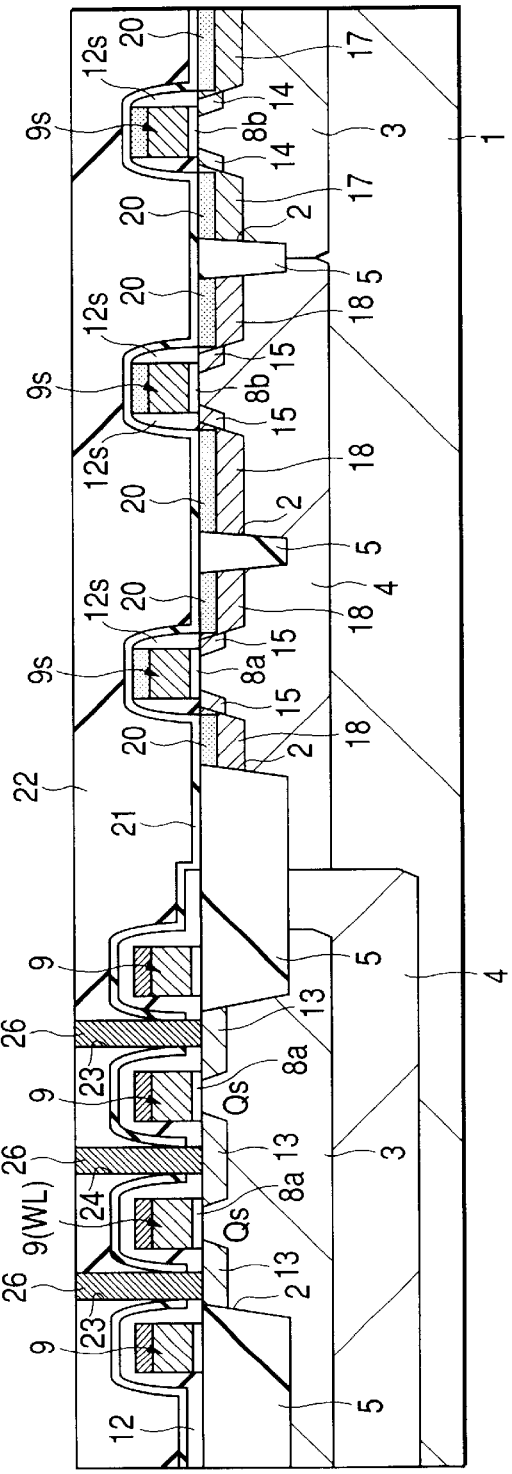

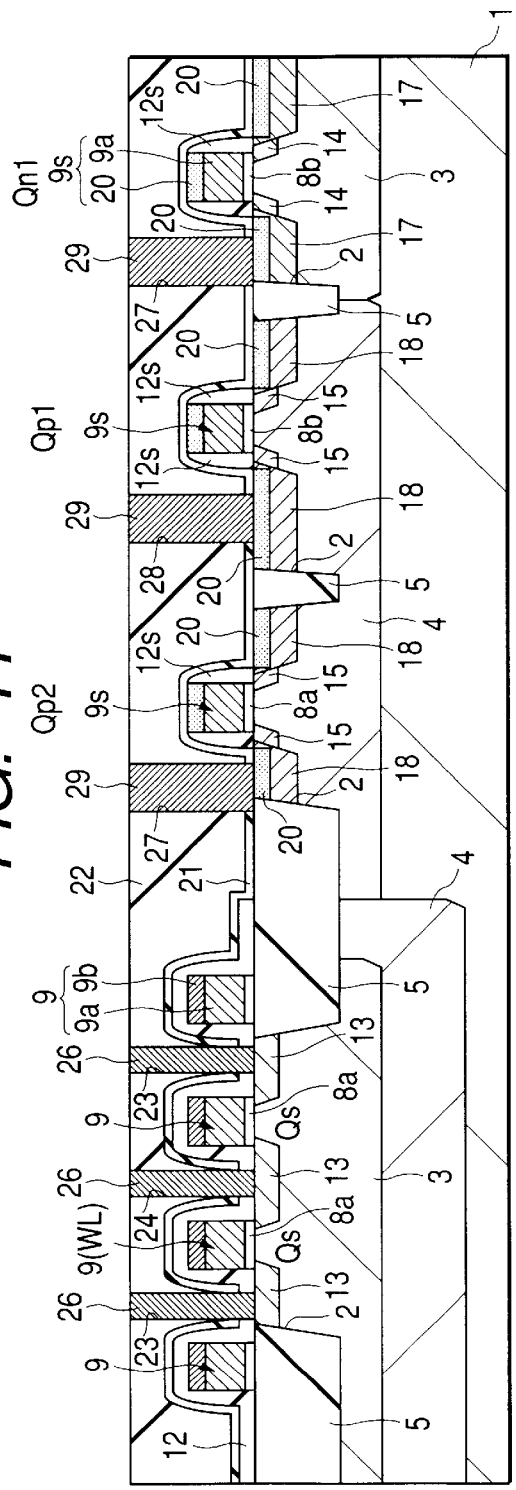
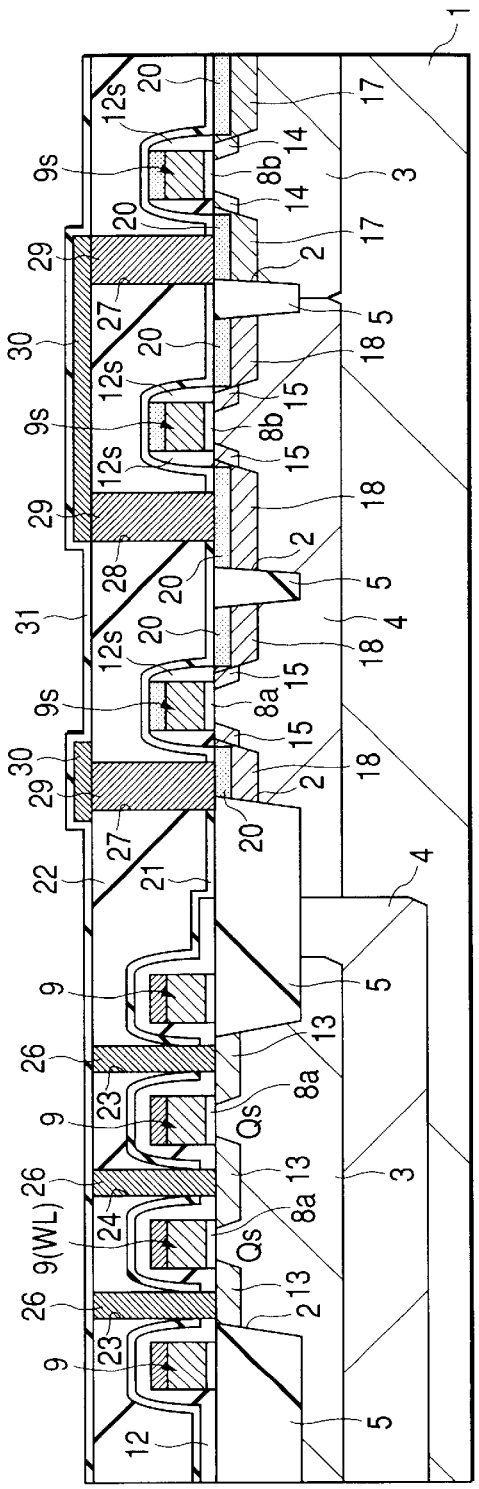

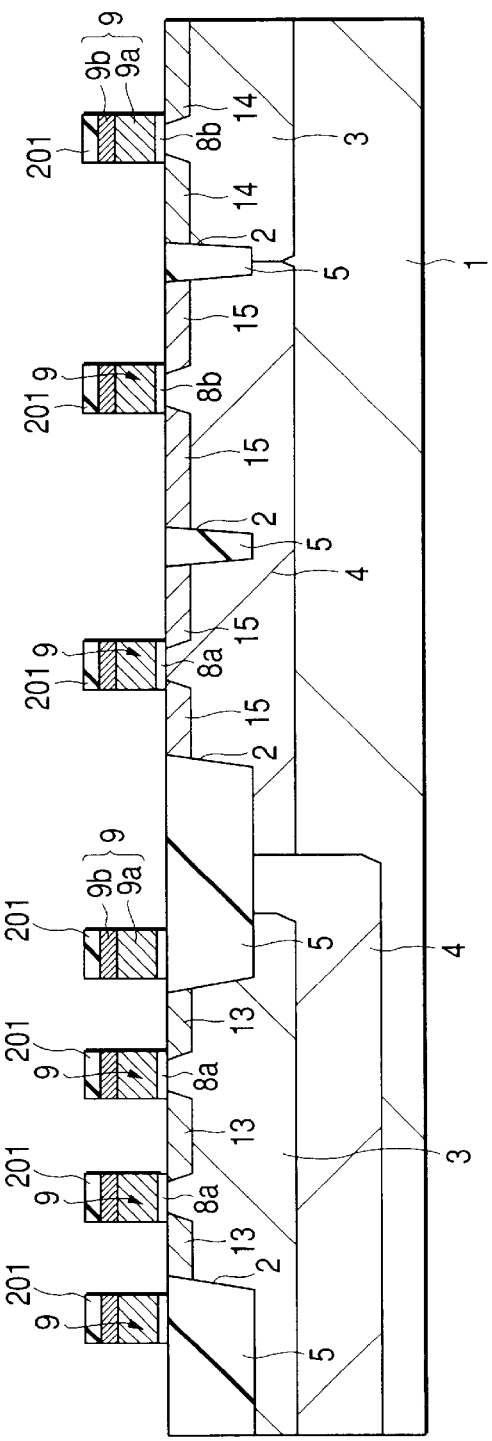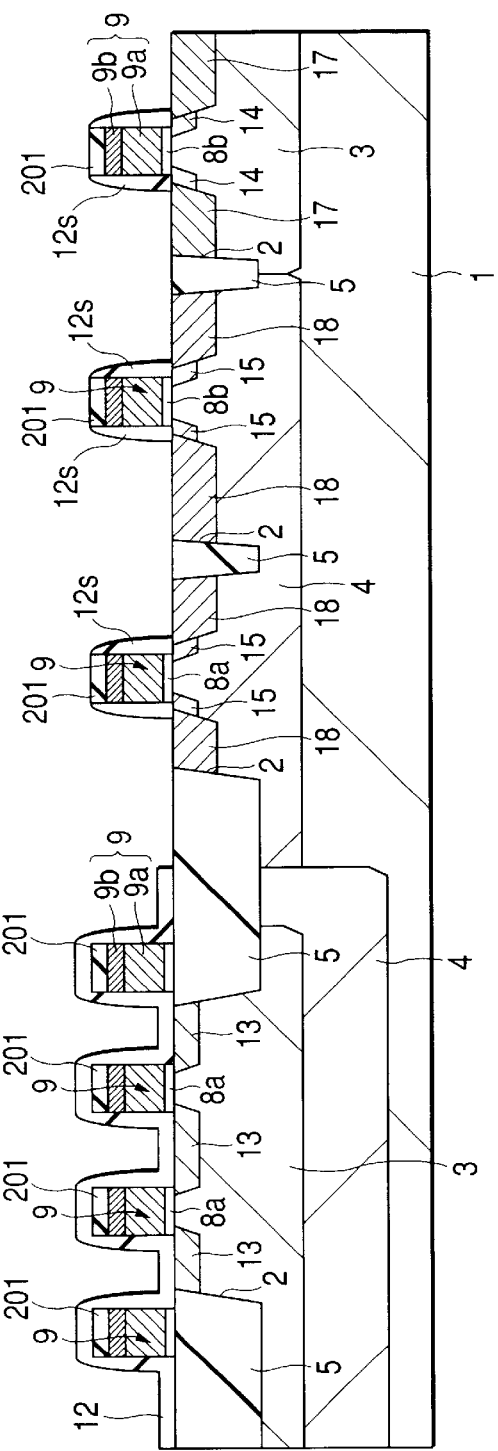

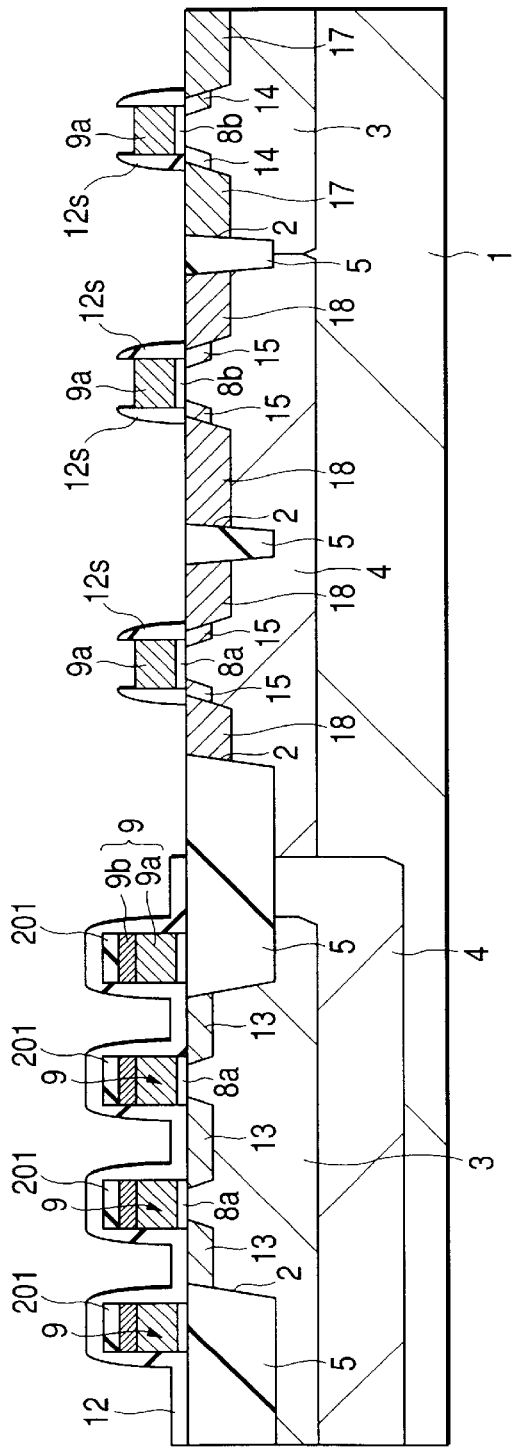
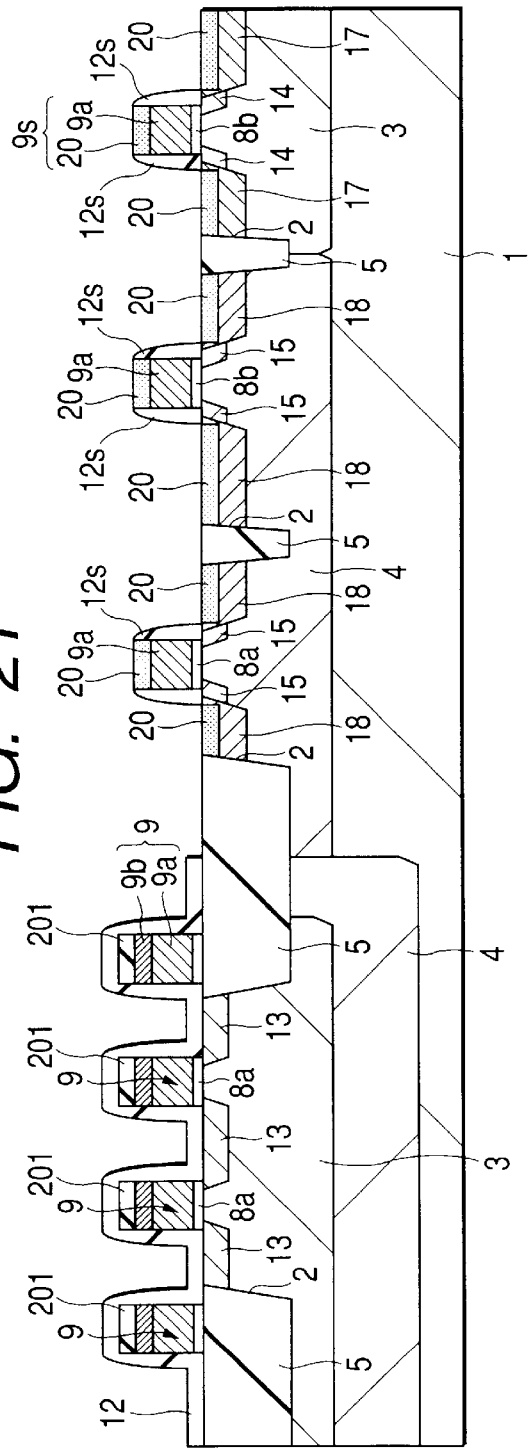

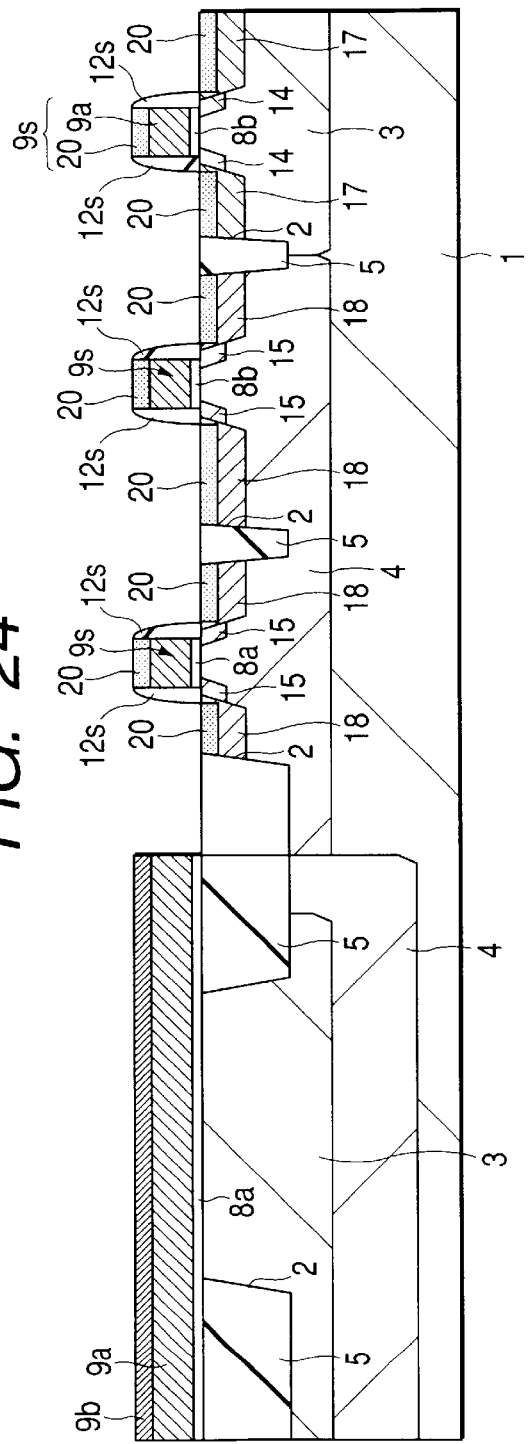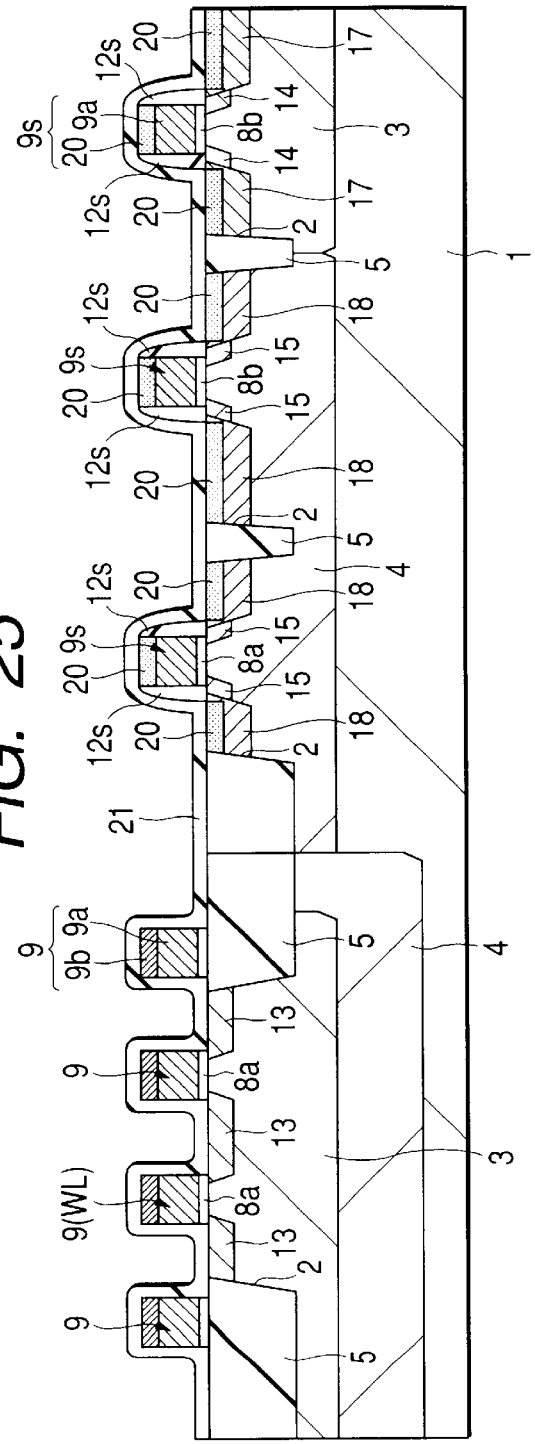

METHOD FOR FABRICATING A SEMICONDUCTOR INTEGRATED CIRCUIT DEVICE

BACKGROUND OF THE INVENTION

This invention relates to a semiconductor integrated circuit device and a manufacturing technique therefor. More particularly, the invention relates to the structure of a semiconductor integrated circuit device having DRAM (dynamic random access memory), a logic integrated circuit and the like in combination and also to a technique effective for application to the manufacture thereof.

This invention relates to a semiconductor integrate circuit device and a manufacturing technique therefor. More particularly, the invention relates to the structure of a semiconductor integrated circuit device having DRAM (dynamic random access memory), a logic integrated circuit and the like in combination and also to a technique effective for application to the manufacture thereof.

In order to realize a low resistance of a gate electrode of MISFET, there is known a technique wherein the gate electrode is made of a built-up film of a polysilicon film and a silicide film, or the gate electrode is made of a built-up film of a polysilicon film and a high melting metal such as tungsten or the like (i.e. a so-called polymetal gate).

On the other hand, for a measure of realizing a high-speed operation of a logic integrated circuit unit, there is known a technique wherein MISFET constituting a logic circuit is formed with a silicide film on the surfaces of a source and a drain thereof, respectively.

For instance, in Japanese Laid-open Patent Application No. 2000-091535 corresponding U.S. Pat. No. 6,069,038, a semiconductor integrated circuit device is stated, which makes use, as a gate electrode, of a built-up film of a polysilicon and a silicide film.

Further, in International Laid-open Application WO98/50951 corresponding U.S. patent Ser. No. 09/423,047, there is described a semiconductor integrated circuit device wherein a gate electrode is made of a built-up film of a polysilicon film and a tungsten (W) film and a silicide layer is formed on the surfaces of a source and a drain of MOSFET for a logic circuit.

SUMMARY OF THE INVENTION

We have studied and developed so-called system LSI wherein DRAM and logic LSI are formed in the same semiconductor substrate.

The DRAM formed in the system LSI has MISFET for information transmission and a capacitor element for information storage connected in series. Logic LSI has a logic circuit wherein an n channel-type MISFET and a p channel-type MISFET are appropriately combined.

Accordingly, for the formation of these elements on the same substrate, it is preferred that the MISFET for information transmission in a memory cell-forming region and the n channel-type MISFET and the p channel-type MISFET in a peripheral circuit-forming region where the logic LSI is formed are, respectively, formed according to a common process as far as circumstances permit.

In order to improve the working speed, it is required that the gate electrode of MISFET for information transmission and the gate electrodes and the sources and drains of the n channel-type MISFET and the p channel-type MISFET in the peripheral circuit-forming region be individually low in resistance. For improving the refresh characteristics of DRAM, it is also required that a leakage current between the source and drain of the MISFET for information transmission be very small.

For reducing the resistance of the gate electrode, a polycide structure may be adopted. The term "polycide gate" means a technique of forming a gate electrode by patterning a built-up film of a polysilicon film and a metal silicide film.

However, this technique is disadvantageous in that the concentration of the metal in the metal silicide film cannot be made appreciably high, thus making it difficult to form a gate electrode having a sufficiently low resistance. The reason why the concentration of the metal in the metal silicide film of the polycide gate electrode cannot be made fairly high is as follows. More particularly, after the step of forming the gate electrode, the step of ion implantation for forming source and drain regions and a subsequent thermal treatment step for activating an impurity are necessary, and this, in turn, requires the adoption, as the metal polysilicide film, of a film that has a heat resistance sufficient to withstand the thermal treatment at high temperatures for the activation of the impurity. For instance, when a conductive film having a concentration of a metal higher than a stoichiometric ratio inherent to an alloy layer is formed over a polysilicon film, the metal is diffused through the high-temperature thermal treatment step, with the possibility that the semiconductor substrate is contaminated at the channel region thereof.

In the polycide gate structure, when the metal silicide film is increased in its thickness, the gate electrode can be made low in resistance. Nevertheless, in order to process a thick film, a photoresist film that is proof against the processing is necessary.

Such a thick photoresist film is poor in resolution, so that gate electrodes arranged at small intervals cannot be processed in high precision. Eventually, it becomes difficult to respond to the scale down of LSI.

Where gate electrodes constituted of a thick film are arranged at small intervals, a ratio between the interval and the height of the gate (i.e. an aspect ratio) becomes large, making it difficult to provide an insulating film or the like between the gate electrodes.

To avoid this, studies have been made on a polymetal gate structure for solving the above problem, in which a barrier metal film for preventing the diffusion of a metal and preventing a silicide reaction is interposed between a conductive film having a high metal concentration and a low resistance and a polysilicon film.

This polymetal gate structure includes, in some instance, a gate electrode constituted, for example, of a built-up film of a polysilicon film, a tungsten nitride (WN) film, and a tungsten (W) film. Aside from the tungsten nitride film, other types of metal nitrides and nitride alloys may be appropriately used as the barrier metal film. In addition, materials for use as the conductive film having a high metal concentration and a low resistance may include, aside from tungsten, other types of metals.

As stated hereinabove, for lowering a sheet resistance and a contact resistance of the source and drain regions of MISFET in the peripheral circuit region and reducing the leakage current between the source and drain of MISFET for information transmission, there is known a method wherein a silicide process is applied only to the MISFET in the peripheral circuit-forming region.

This silicide process comprises forming a metal film such as cobalt (Co), titanium (Ti) or the like on a silicon substrate, and thermally treating the film to selectively form a metal silicide layer only in a region where polysilicon or a silicon layer such as of the silicon substrate is exposed.

On the other hand, a thick etching stopper film, which is necessary for a self aligned contact (SAC) process, has to be formed on the gate electrode or side walls of the MISFET for information transmission. The etching stopper film is a film that permits an appropriate selection ratio of etching relative to an interlayer insulating film and includes, for example, an SiN film or the like.

However, where an etching stopper film is formed on the gate electrode of MISFET in the peripheral circuit-forming region along with the formation of the etching stopper film on the gate electrode or side walls of the MISFET for information transmission, it is necessary to remove the etching stopper film from the gate electrode of the MISFET in the peripheral circuit-forming region.

This is for the reason that when contact holes are made over the source and drain regions and the gate electrode of the peripheral circuit region simultaneously, the element isolation region is exposed to etching conditions over a long time, resulting in over-etching. As a result, short-circuiting takes place between a contact plug and the substrate. In order to prevent the short-circuiting, it undesirably becomes necessary to form a contact hole over the source and drain region of the peripheral circuit region and a contact hole over the gate electrode by separate steps.

However, if these contact holes are formed by separate steps, a matching allowance has to be guaranteed in the respective steps, disenabling the scale down of the element.

To avoid this, Japanese Laid-open Patent Application No. 2000-091535 proposes a method in which where a polycide gate structure is adopted, an etching stopper film on a gate electrode in a peripheral circuit-forming region has been removed beforehand.

However, when the method set out in the above application is applied to a polymetal gate structure, there has arisen the problem that a metal layer and a barrier metal layer constituting the polymetal gate are dissolved through a cleaning treatment such as with hydrofluoric acid so as to clean the substrate surface prior to the silicide process. This is a problem which occurs due to the chemical instability of a metal film constituting the polymetal gate in comparison with the metal silicide film of the polycide gate.

In this way, it is difficult that the metal film on the polymetal gate is stably left in an exposed state where the etching stopper film has been removed. Moreover, when the metal film changes in thickness, the sheet resistance of the gate electrode greatly changes, thus adversely influencing the operations of the element. Accordingly, in case where the etching stopper film has been removed from the polymetal gate in the peripheral circuit-forming region, such a semiconductor integrated circuit device and fabrication thereof as to suppress the variation in sheet resistance of the gate electrode becomes necessary.

An object of the invention is to reduce a leakage current at the source and drain regions of MISFET for information transmission and improve refresh characteristics of DRAM.

Another object of the invention is to provide a technique which is responsible for a low resistance of a gate electrode and a low resistance of a source and a drain in a peripheral circuit-forming region and also for the microfabrication of a device.

A further object of the invention is to realize the high performance and the high degree of integration of a DRAM unit and a logic LSI unit.

These and other objects and novel features of the invention will become apparent from the description of the specification with reference to the accompanying drawings.

Typical embodiments of the invention are briefly described below.

1. The semiconductor integrated circuit device of the invention is arranged such that a gate electrode of MISFET for information transmission in a memory cell-forming region has a metal layer, and gate electrodes of n channel-type MISFET and p channel-type MISFET in a peripheral circuit-forming region, respectively, have a first metal silicide layer wherein these MISFET's, respectively, have a second metal silicide layer formed on a source and a drain thereof. According to this arrangement, the gate electrode of the MISFET for information transmission can be made low in resistance. Moreover, the gate electrodes of the n channel and p channel-type MISFET's in the peripheral circuit-forming region can be made low in resistance, and the source and drain thereof can also be made low in resistance.

Further, because no metal silicide layer is formed on the source and drain of the MISFET for formation transmission, it is expected to improve refresh characteristics owing to the reduction of a leakage current.

The gate electrode of the MISFET for information transmission is formed of a built-up film of a silicon layer and a metal layer formed thereon. The gate electrodes of the n channel-type MISFET and p channel-type MISFET in the peripheral circuit-forming region are, respectively, made of a silicon layer and a metal silicide layer formed thereon. The metal silicide includes, for example, cobalt or titanium silicide. The metal silicide layer is formed by silification reaction.

A buried conductive layer may be formed on the gate electrode of the n channel-type MISFET or p channel-type MISFET in the peripheral circuit-forming region. In this way, no protective layer is formed over the gate electrode of the n channel-type MISFET or p channel-type MISFET, and thus, a contact hole in which a buried conductive layer is formed can be precisely formed.

2. The semiconductor integrated circuit device of the invention is arranged such that a gate electrode of MISFET for information transmission in a memory cell-forming region has a metal layer, and gate electrodes of n channel-type MISFET and p channel-type MISFET constituting SRAM memory cell in a peripheral circuit-forming region, respectively, have a first metal silicide layer wherein these MISFET's, respectively, have a second metal silicide layer formed on a source and a drain thereof. According to this arrangement, the gate electrode of the MISFET for information transmission can be made low in resistance. Moreover, the gate electrodes of the n channel and p channel-type MISFET's constituting SRAM can be made low in resistance, and the source and drain thereof can also be made low in resistance.

Because any metal silicide layer is formed on the source and drain of the MISFET for information transmission, it is possible to improve refresh characteristics owing to the reduction in leakage current.

The gate electrode of the MISFET for information transmission is formed of a built-up film of a silicon layer and a metal layer formed thereon. The gate electrodes of the n channel-type MISFET and the p channel-type MISFET for SRAM are, respectively, formed of a silicon layer and a metal silicide layer formed thereon. The metal layer is made, for example, of tungsten. The metal silicide includes, for example, cobalt or titanium silicide. The metal silicide layer is formed by silification reaction.

A buried conductive layer may be formed over the gate electrode of the n channel-type MISFET or the p channel-type MISFET constituting SRAM. In this way, no protective layer is formed over the gate electrode of the n channel-type MISFET or p channel-type MISFET, and thus, a contact hole in which a buried conductive layer is formed can be precisely formed.

3. A method for fabricating a semiconductor integrated circuit device according to the invention comprises the steps of successively forming a polysilicon film and a high melting metal film on a gate insulating film and patterning the films to form a gate electrode in a memory cell-forming region and a peripheral circuit-forming region, respectively, removing the high melting metal film from the gate electrode in the peripheral circuit-forming region, and depositing a metal layer over the peripheral circuit-forming region, followed by thermal treatment to form a silicide film on the polysilicon film and a high concentration diffusion layer in the gate electrode of the peripheral circuit-forming region. According to this method, there can be obtained a semiconductor integrated circuit device having a high performance and a high degree of integration. Moreover, in case where a contact hole is formed over the silicide film on the polysilicon film of the peripheral circuit-forming region in a subsequent step, the silicide film has no protective film, so that the contact hole can be formed in high precision.

4. The above method can be applied to the fabrication of a semiconductor integrated circuit device having an n channel-type MISFET and a p channel-type MISFET constituting SRAM formed in a peripheral circuit-forming region.

BRIEF DESCRIPTION OF THE DRAWINGS

FIG. 1 is a sectional view showing an essential part of a substrate in one step of a method for fabricating a semiconductor integrated circuit device according to Embodiment 1 of the invention;

FIG. 2 is a sectional view showing the essential part of the substrate in subsequent step of the method of FIG. 1;

FIG. 3 is a sectional view showing the essential part of the substrate in a step subsequent to FIG. 2;

FIG. 4 is a sectional view showing the essential part of the substrate in a step subsequent to FIG. 3;

FIG. 9 is a sectional view showing the essential part of the substrate in a step subsequent to FIG. 8;

FIG. 10 is a sectional view showing the essential part of the substrate in a step subsequent to FIG. 9;

FIG. 11 is a sectional view showing the essential part of the substrate in a step subsequent to FIG. 10;

FIG. 12 is a sectional view showing the essential part of the substrate in a step subsequent to FIG. 11;

FIG. 18 is a sectional view showing an essential part of a substrate in one step of a method for fabricating a semiconductor integrated circuit device according to Embodiment 2 of the invention;

FIG. 19 is a sectional view showing the essential part of the substrate in a step subsequent to FIG. 18;

FIG. 20 is a sectional view showing the essential part of the substrate in a step subsequent to FIG. 19;

FIG. 21 is a sectional view showing the essential part of the substrate in a step subsequent to FIG. 20;

FIG. 24 is a sectional view showing the essential part of the substrate in a step subsequent to FIG. 23;

FIG. 25 is a sectional view showing the essential part of the substrate in a step subsequent to FIG. 24;

DETAILED DESCRIPTION OF THE PREFERRED EMBODIMENTS

Figure 5:
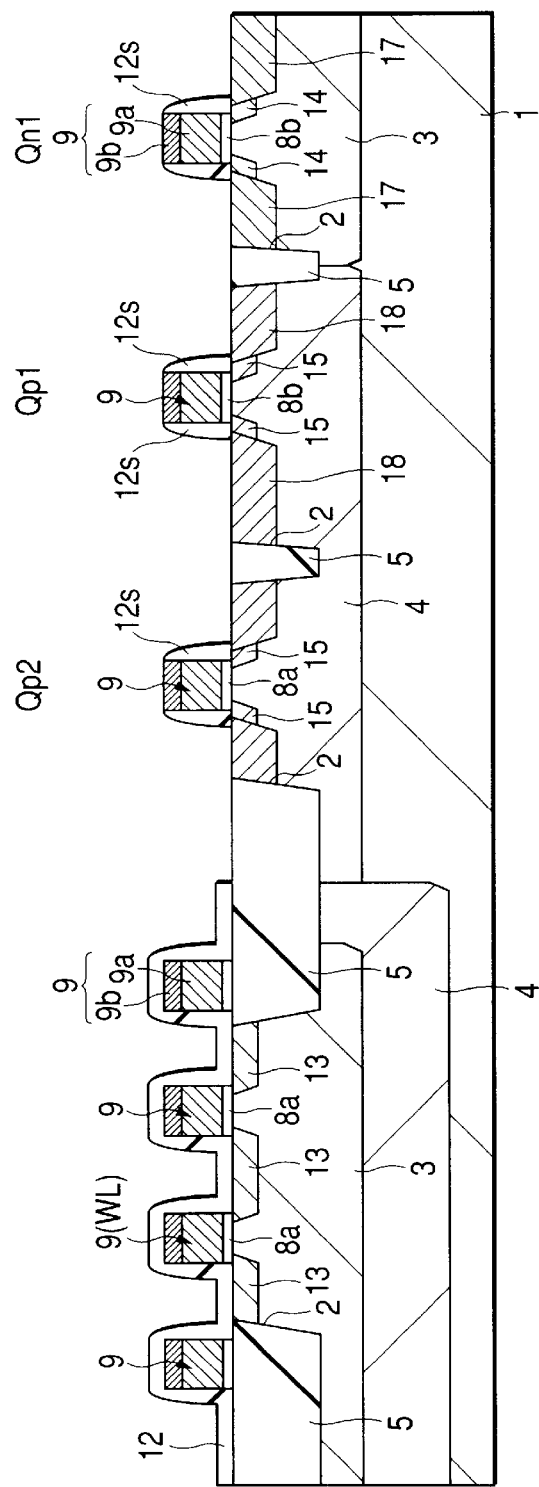
FIG. 5 is a sectional view showing the essential part of the substrate in a step subsequent to FIG. 4.

Embodiments of the invention are more particularly described with reference to the accompanying drawings. It will be noted that like reference numerals indicate like members or parts throughout the accompanying drawings illustrating the embodiments of the invention and are not repeatedly illustrated.

(Embodiment 1)

A method for fabricating a semiconductor integrated circuit device according to Embodiment 1 of the invention is described in sequence of steps with reference to FIG. 1 to FIG. 16. Each left side and each right side of drawings showing a section of a semiconductor substrate respectively show a region (memory cell forming region) in which the memory cell for DRAM is formed and a peripheral circuit-forming region in which a logic circuit or the like is formed.

As shown in FIG. 1, an element isolation 2 is formed in a semiconductor substrate 1. The element isolation 2 is formed in the following way. A silicon nitride film (not shown) is formed on an element-forming region of the semiconductor substrate made, for example, of p-type single crystal silicon having a specific resistance of about 1 to 10

Ωcm, followed by etching of the semiconductor substrate 1 through the silicon nitride film as a mask to form a groove with a thickness of approximately 350 nm.

Thereafter, the semiconductor substrate is thermally oxidized to form a thin silicon oxide film (not shown) on inner walls of the groove. Next, a silicon oxide film 5 having a thickness of approximately 450 to 500 nm is deposited over the semiconductor substrate 1 including the inside of the groove according to a CVD (chemical vapor deposition) method, followed by polishing the silicon oxide film 5 over the groove according to a chemical mechanical polishing (CMP) method, thereby causing the surface to be flattened or planarized. Subsequently, the silicon nitride film is removed. This silicon nitride film serves as an oxidation-resistant mask during the course of the thermal oxidation and also acts as a stopper film during the polishing.

Next, a p-type impurity (e.g. boron) and an n-type impurity (e.g. phosphorus) are subjected to ion implantation into the semiconductor substrate 1, followed by thermal treatment at about 1000° C. to form a p-type well 3 and a deep n-type well 4 in the semiconductor substrate 1 at a memory cell-forming region thereof and a p-type well 3 and an n-type well 4 in the semiconductor substrate 1 at the peripheral circuit-forming region thereof. This thermal treatment is carried out for activation of the impurity ions and also for crystal defects caused in the semiconductor substrate 1.

At this stage, impurity regions (not shown) having the same potential as the impurity constituents for these wells are formed on the surfaces of the p-type well 3 and the n-type well 4 by ion implantation, respectively. This impurity region is formed by controlling threshold voltages of MISFET Qs for information transmission, n channel-type MISFET Qn1 and p channel-type MISFET's Qp1, Qp2 formed on these wells, respectively. The above-mentioned thermal treatment may be performed according to a RTP (rapid thermal process) technique.

Thereafter, as shown in FIG. 2, a hydrofluoric acid-based cleaning solution is used to subject the surfaces of the semiconductor substrate 1 (p-type well 3 and n-type well 4) to wet cleaning, followed by thermal oxidation at about 800° C. to form a clean gate oxide film 8a having a thickness of approximately 7 to 8 nm on the surfaces of the p-type well 3 and the n-type well 4, respectively. Subsequently, a hydrofluoric acid-based cleaning solution is used to selectively remove the gate oxide film 8a of the semiconductor substrates 1 (p-type well 3 and n-type well 4) from regions (MISFET Qn1, Qp2-forming regions), in which a high-speed logic circuit is to be formed, of the peripheral circuit-forming region. Thereafter, thermal oxidation is effected to form a clean gate oxide film 8b having a thickness of approximately 2 to 4 nm on the region where the high-speed logic circuit is to be formed. The working voltage of the MISFET having the gate oxide film 8a is at 2.5 to 3.3 V, and the working voltage of the MISFET having the gate oxide film 8b is at 1.0 to 1.8 V. It will be noted that the gate oxide films 8a, 8b are very thin and are depicted in FIG. 2 as having a similar thickness. It should also be noted that in a subsequent step, an impurity region may be formed in order to control such a threshold voltage as mentioned hereinabove.

Subsequently, a polysilicon film 9a having a thickness of approximately 100 nm, which is not doped with any impurity is deposited on the gate oxide films 8a, 8b by a CVD method. An n-type impurity (phosphorus or arsenic, or both) is ion implanted into the polysilicon film 9a of the memory cell forming region over the n-type well 4 of the peripheral circuit-forming region. A p-type impurity (boron) is likewise ion implanted into the polysilicon film 9a over the p-type well of the peripheral circuit-forming region.

Thereafter, a W (tungsten) film 9b having a thickness of approximately 50 nm is deposited on the polysilicon film 9a.

As shown in FIG. 3, the W film 9b as a metal layer and the polysilicon film 9a are dry etched through a mask of a photoresist film (not shown) to form gate electrodes 9, each made of the polysilicon film 9a and the W film 9b, at the memory cell-forming region and the peripheral circuit-forming region. It will be noted that the gate electrode 9 formed in the memory cell-forming region functions as a word line WL. Thereafter, a thin oxide film (not shown) having a thickness of approximately 4 nm is formed on side walls of the polysilicon film 9a by wet hydrogen oxidation. This oxidation is carried out so as to recover the damage of the gate insulating film occurring during the course of the dry etching of the W film 9b and the polysilicon 9a.

In this way, according to this embodiment of the invention, the gate electrode 9 is formed through etching of the built-up film of the polysilicon film 9a and the W film 9b, thus ensuring microfabrication of the element. More particularly, it can be avoided to lower the resolution of a photoresist film and increase a ratio between the gate interval and the gate height (i.e. an aspect ratio) as will be caused by the formation of such a thick gate insulating film as set forth hereinbefore.

Next, an n-type impurity (phosphorus and arsenic) is injected into the p-type well 3 in the memory cell-forming region at both sides of the gate electrode 9, thereby forming n⁻-type semiconductor regions (source, drain). Likewise, an n-type impurity (arsenic) is injected into the p-type well 3 in the peripheral circuit-forming region to form an n⁻-type semiconductor region (diffusion layer) 14, and a p-type impurity (boron or boron and indium) is injected into the n-type well 4 to form a p⁻-type semiconductor region 15.

Upon the formation of the n⁻-type semiconductor region 14 in the p-type well 3 of the peripheral circuit-forming region, boron may be ion implanted to form a semiconductor region (i.e. a punch-through stopper region not shown) of the opposite conduction type (i.e. p-type) about the n⁻-type semiconductor region 14 (except the channel region) in the p-type well 3 of the peripheral circuit-forming region. Likewise, upon the formation of the p⁻-type semiconductor region 15 in the n-type well 4, phosphorus or arsenic may be ion implanted so as to form a semiconductor region (a punch-through stopper region not shown) of the opposite conduction type (n-type) about the p⁻-type semiconductor region 15 in the n-type well. This punch-through region acts to suppress the expansion of a depletion layer from the n⁻-type semiconductor region 14 or p⁻-type semiconductor region 15, thereby suppressing a short channeling effect. Thereafter, the impurities are activated by RTP under conditions of 900° C. and 1 minute.

As shown in FIG. 4, a silicon nitride film 12 having a thickness of approximately 50 nm is deposited over the semiconductor substrate 1 by a CVD method, followed by coverage of the memory cell-forming region with a photoresist film PR. This silicon nitride film 12 is used, in the memory cell-forming region, as a mask in the step of removing the W film 9b or in the step of forming a silicide film as will be described hereinafter and as a film for forming a side wall film in the peripheral circuit-forming region.

As shown in FIG. 5, the silicon nitride film 12 on the peripheral circuit-forming region is anisotropically etched to form a side wall film 12s on the side walls of the gate electrode 9 of the peripheral circuit-forming region. At this stage, the silicon nitride film 12 is removed from the gate electrode 9 to expose the W film 9b. Moreover, the silicon nitride film 12 on the n⁻-type semiconductor region 14 and the p⁻-type semiconductor region 15 is also removed, thereby causing the surfaces of the n⁻-type semiconductor region 14 and the p⁻-type semiconductor region 15 to be exposed.

Next, an n-type impurity (phosphorus or arsenic) is ion implanted into the p-type well 3 in the peripheral circuit-forming region to form n⁺-type semiconductor regions 17 (source, drain), and a p-type impurity (boron) is likewise ion implanted into the n-type well 4 to form p⁺-semiconductor regions 18 (source, drain). Thereafter, the impurities are activated through RTP under conditions of 900° C. for 1 minute. In this embodiment, the n⁺-type semiconductor region 17 and the p⁺-type semiconductor region 18 have been, respectively, formed after the formation of the side wall film 12s on the side walls of the gate electrode 9 in the peripheral circuit-forming region. However, the p⁺-type semiconductor region 18 maybe formed after the formation of the side wall film 12s on the side walls of the gate electrode 9 over the n-type well 4 of the peripheral circuit-forming region, followed by formation of the n⁺-type semiconductor region 17 after the formation of the side wall film 12s on the side walls of the gate electrode 9 over the n-type well 3.

According to this step, formation of the side wall film 12s and the ion implantation of the impurity can be carried out using the same mask.

According to the steps set forth hereinabove, there can be formed an n channel-type MISFET Qn1 and p channel-type MISFET's Qp1, Qp2, each provided with a source and a drain having an LDD (lightly doped drain) structure in the peripheral circuit-forming region.

Figure 6:
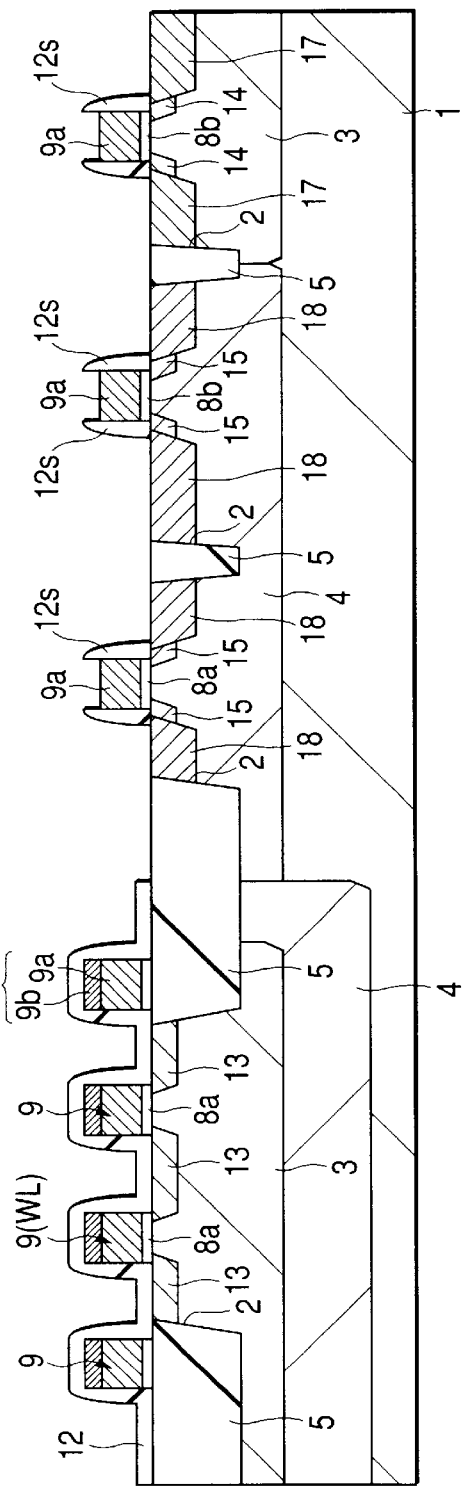
FIG. 6 is a sectional view showing the essential part of the substrate in a step subsequent to FIG. 5.

As shown in FIG. 6, the W film 9b in the peripheral circuit-forming region is removed by etching. For the etching, hydrofluoric acid or aqueous hydrogen peroxide is used. When using an aqueous solution of the acid or hydrogen peroxide, the W film 9b can be readily removed. In this way, the peripheral circuit-forming region has the polysilicon film 9a in an exposed state. It will be noted that the W film 9b of the memory cell-forming region is covered with the silicon nitride film 12 and is not thus etched.

Figure 7:
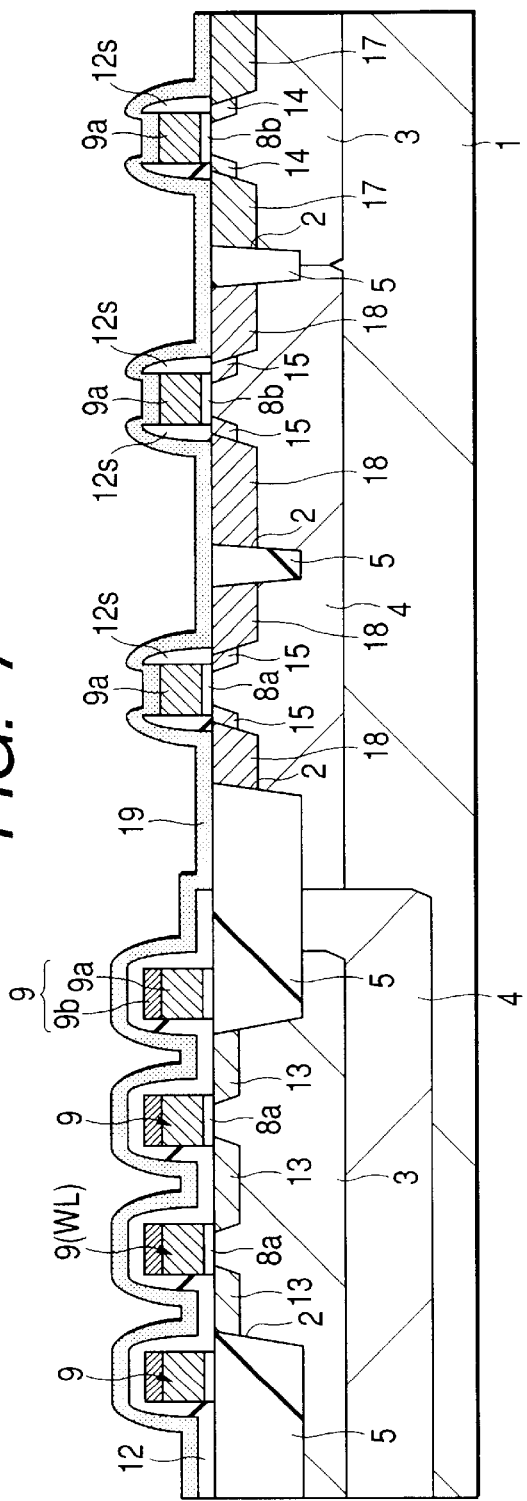
FIG. 7 is a sectional view showing the essential part of the substrate in a step subsequent to FIG. 6.
Figure 8:
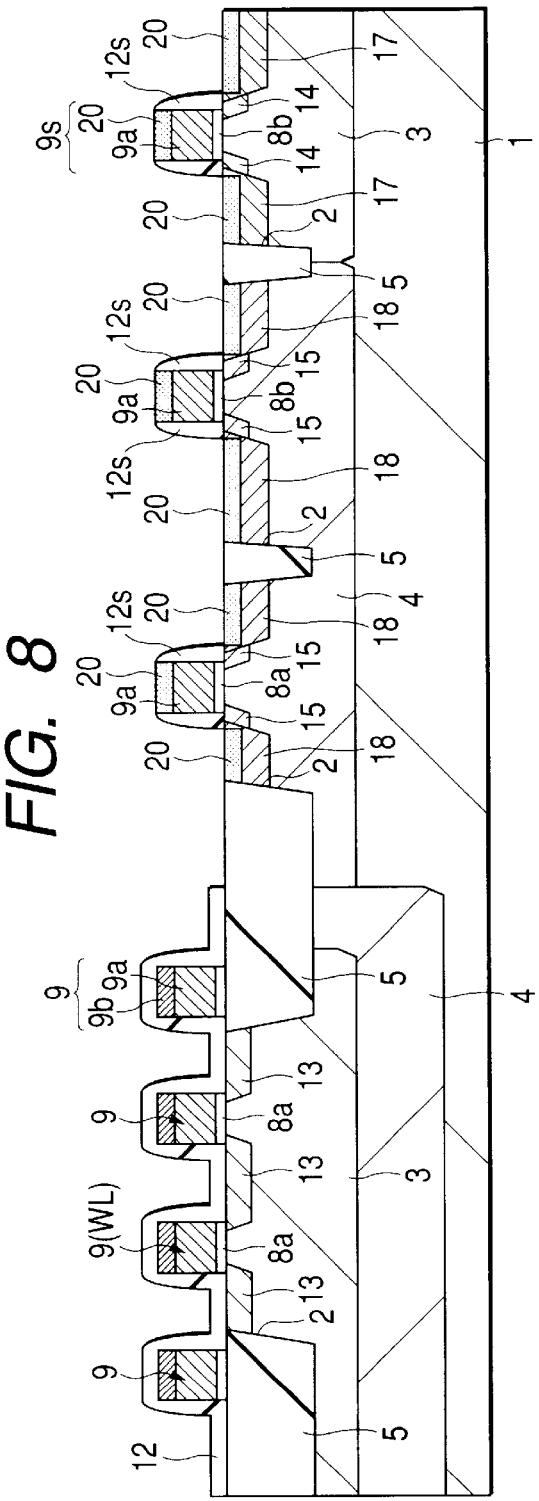
FIG. 8 is a sectional view showing the essential part of the substrate in a step subsequent to FIG. 7.

Next, as shown in FIG. 7, a cobalt (Co) film 19 is deposited over the semiconductor substrate 1 by a sputtering method. The Co film 19 may be replaced by a titanium (Ti) film. At the contact between the Co film 19 and the polysilicon film 9a of the peripheral circuit-forming region and also at contacts between the Co film 19 and the n⁺-type semiconductor region 17 and p⁺-type semiconductor region 18, a silicification reaction is caused to occur, thereby forming a cobalt silicide (CoSi) layer 20. This CoSi layer 20 as a metal silicide layer is formed by RSP under conditions of 500° C. to 600° C. for 1 minute. Subsequently, an unreacted Co film 19 is removed, followed by further RSP under conditions of 700° C. to 800° C. for 1 minute to permit a low resistance CoSi layer 20 to be formed (FIG. 8). In this way, the CoSi layer 20 is formed on the polysilicon film 9a in the peripheral circuit-forming region, and the gate electrodes 9s, each made of a built-up film of the polysilicon film 9a and the CoSi layer 20, are formed in the peripheral circuit-forming region. In addition, the CoSi layer 20 is formed on the n⁺-type semiconductor regions 17 (source, drain) and the p⁺-type semiconductor regions 18 (source, drain) in the peripheral circuit-forming region. The memory cell-forming region is covered with the silicon nitride 12, so that any CoSi layer is not formed.

Thus, according to this embodiment, the gate electrodes 9s of the peripheral circuit-forming region are each constituted of the built-up film of the polysilicon film 9a and the CoSi layer 20, so that it becomes possible to make a low resistance gate electrode 9s. Since the CoSi layer 20 is formed on the n⁺-type semiconductor regions 17 (source, drain) and the p⁺-type semiconductor regions 18 (source, drain) in the peripheral circuit-forming region, the source and drain can be made low in resistance. Moreover, the contact resistance between the plugs on the source and drain and the source and drain can be made low as will be described hereinafter.

Further, because any CoSi layer 20 is not formed on the n⁻-type semiconductor region 13 in the memory cell-forming region, it is possible to reduce a junction leakage current. Eventually, the refresh time can be prolonged. The term "refresh time" means a time capable of leading an electric charge stored in a capacitor element C for information storage connected to the MISFET Qs for information transmission.

Subsequently, as shown in FIG. 9, a silicon nitride film 21 having a thickness of approximately 20 nm to 50 nm is deposited over the semiconductor substrate 1 by a CVD method. This silicon nitride film 21 is used as a stopper film when contact holes 23, 24, 27 and 28 are formed as will be described hereinafter.

Next, a silicon oxide film having a thickness of approximately 700 nm to 800 nm is deposited over the silicon nitride film 21 by a CVD method, after which the silicon oxide film is polished according to a CMP method to flatten the surface thereof, thereby forming an interlayer insulating film 22. This interlayer insulating film 22 may be formed of a PSG film, a BPSG film or the like. Alternatively, the interlayer insulating film may be formed of a built-up film of a silicon oxide film, a PSG film and/or a BPSG film. Where phosphorus is present in the interlayer insulating film 22, the threshold potential of MISFET can be stabilized due to the gettering action.

Next, as shown in FIG. 10, the interlayer insulating film 22 and the silicon nitride films 21, 12 as first, second and third insulating films over the n⁻-type semiconductor region 13 of the memory cell-forming region are removed by etching to form contact holes 23, 24, thereby causing the surfaces of the semiconductor substrate 1 (n⁻-type semiconductor region 13) to be exposed.

The etching of the interlayer insulating film 22 (silicon oxide film) is effected under such conditions that the etching rate against silicon oxide is greater than that of silicon nitride so as not to completely remove the silicon nitride films 21, 12. Moreover, the etching of the silicon nitride films 21, 12 is effected under such conditions that the etching rate against silicon nitride is greater than those against silicon (semiconductor substrate) and silicon oxide so that the semiconductor substrate 1 and the silicon oxide film 5 are not etched deeply. As a result, the contact holes 23, 24 having a very small diameter are formed self-alignedly relative to the gate electrode 9 (word line WL).

Thereafter, an n-type impurity (phosphorus or arsenic) is ion implanted into the p-type well 3 (n⁻-type semiconductor region 13) in the memory cell-forming region via the contact holes 23, 24, thereby forming an n⁺-type semiconductor region (not shown). According to the steps described hereinabove, there is formed the MISFET Qs for information transmission of the n channel type in the memory cell-forming region.

Next, a plug 26 is formed in the contact holes 23, 24, respectively. The plug 26 is formed by a low resistance polysilicon, in which an n-type impurity such as phosphorus (P) is doped at approximately $4 \times 10^{20}/cm^3$ is deposited over the interlayer insulating film 22 including the inside of the contact holes 23, 24 by a CVD method, and etching back (or polishing by a CMP method) the polysilicon film to leave the polysilicon film only in the inside of the contact holes 23, 24.

As shown in FIG. 11, the interlayer insulating film 22 and the lower-layer silicon nitride film 21 in the peripheral circuit-forming region is subjected to dry etching to form a contact hole 27 over the source and drain ($n^+$-type semiconductor regions 17) of the n channel-type MISFET Qn1 and a contact hole 28 over the source and drain ($p^+$-type semiconductor regions 18) of the MISFET's Qp1, Qp2. Simultaneously, a contact hole (not shown) is formed over the gate electrodes of the p channel-type MISFET and n channel-type MISFET in the peripheral circuit-forming region. At this stage, there may be formed a contact hole that extends from over the gate electrode such as of the p channel-type MISFET or the like in the peripheral circuit-forming region to the source and drain regions of the p channel-type MISFET or other MISFET.

The etching of the interlayer insulating film 22 (silicon oxide film) is also effected under conditions where the etching rate against silicon oxide is greater than that against silicon nitride so that the silicon nitride film 21 is not completely removed. The etching of the silicon nitride film 21 is effected under conditions where the etching rate against silicon nitride becomes greater in comparison with silicon (semiconductor substrate) or silicon oxide so that the semiconductor substrate 1 and the silicon oxide film 5 are not etched off deeply. As a result, the contact holes 27, 28 having a very small diameter are formed self-alignedly to the gate electrodes 9s.

As will be apparent from the above, in this embodiment, the upper portion of the gate electrode 9s in the peripheral circuit-forming region is formed of the CoSi layer 20, so that any silicon nitride for protection is not left over the gate electrode 9s, ensuring the precise formation of the contact holes 27, 28.

Figure 17:
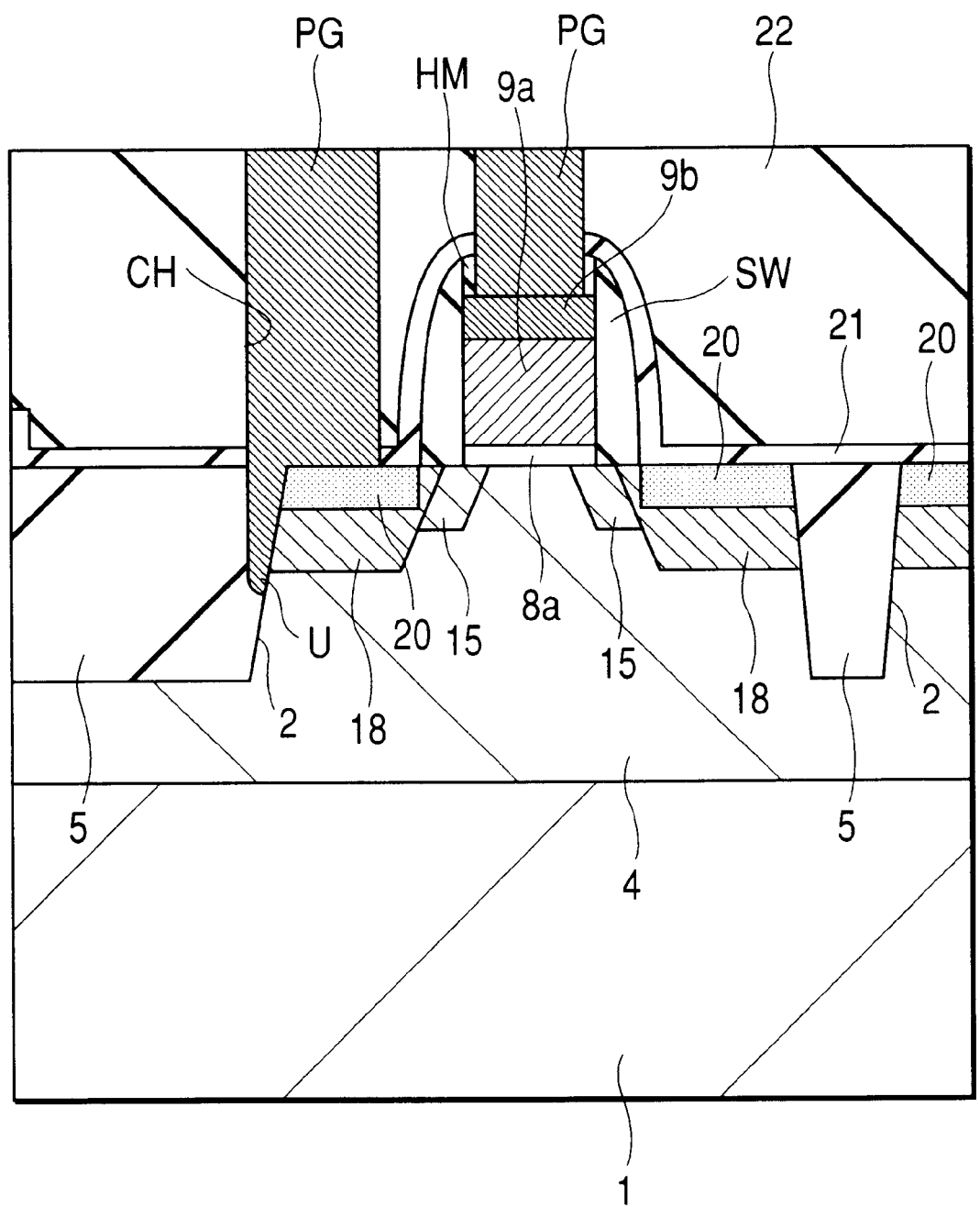
FIG. 17 is a sectional view of an essential part of a substrate for illustrating the features and effects of the invention.

More particularly, as shown in FIG. 17, where a W film of the peripheral circuit-forming region is formed over a gate electrode, a silicon nitride film HM for protecting the W film becomes necessary. On the other hand, in order to form a source and a drain of such an LDD structure as set forth hereinbefore, a side wall film SW is formed on side walls of the gate electrode. Accordingly, in case where a contact hole CH is simultaneously formed on the gate electrode and the source or drain of MISFET having such an LDD structure, there is the possibility that the vicinity of the source or drain (18) is more deeply etched correspondingly to a thickness of the silicon nitride film HM on the gate electrode.

Especially, the silicon oxide film 5 is buried in the element isolation region 2 and is etched more deeply, with the likelihood that a groove (recess) U is formed. Moreover, when a conductive film is buried in the contact hole having the groove (recess) U formed therein to form a plug PG, a leakage current is generated via the groove (recess) U.

In this embodiment, however, the contact holes 27, 28 and the like (including a contact hole (not shown) over the gate electrode) can be formed in high precision.

It will be noted that although not shown in the figures, a leading region of the word line WL exists in the memory cell-forming region. More particularly, a contact hole is formed over the word line WL (gate electrode 9), in which a conductive film is buried so as to connect an upper layer wiring and the word line WL. The contact hole over the word line WL has to be formed by a step different from the step for the contact holes 27, 28 because of the existence of the silicon nitride film 12 on the word line WL. The W film 9b on the leading region of the word line WL may be removed to form a CoSi layer 20, like the peripheral circuit-forming region. In this case, the contact hole over the word line WL and the contact holes 27, 28 and the like may be formed according to the same step.

Next, a thin Ti film and a TiN film (not shown) are successively deposited by a CVD method on the interlayer insulating film 22 including the insides of the contact holes 27, 28 and a contact hole, not shown, over the gate electrode of MISFET, followed by subjecting to RTP under conditions of 500 to 600° C. for 1 minute so as to lower the contact resistance between the CoSi layer 20 and these layers. Thereafter, after deposition of a W film having a thickness of approximately 300 nm on the TiN film, the W film over the interlayer insulating film 22 is polished by CMP method and left only in the inside of the contact holes 27, 28, etc., thereby forming a plug 29 as a buried conductive layer.

As shown in FIG. 12, a first layer wiring 30 is formed over the plug 29 in the peripheral circuit-forming region. The first layer wiring 30 is formed, for example, by depositing a W film having a thickness of approximately 100 nm over the interlayer insulating film 22 including the plug 29 and dry etching the W film through a mask of a photoresist film. It will be noted that a thin WN film may be formed as an underlying layer of the W film to form the first layer wiring 30 made of the double layer structure of the WN film and the W film. The W film is thermally stable and is not degraded when subjected to thermal treatment at the time of forming a capacitor element C for information storage as will be described hereinafter.

Next, a silicon nitride film 31 having a thickness of approximately 20 to 50 nm is deposited over the first layer wiring 30 by a CVD method. This silicon nitride film 21 serves as a stopper film when a groove 34, in which a capacitor element for information storage is to be formed as will be described hereinafter, is formed.

Figure 13:
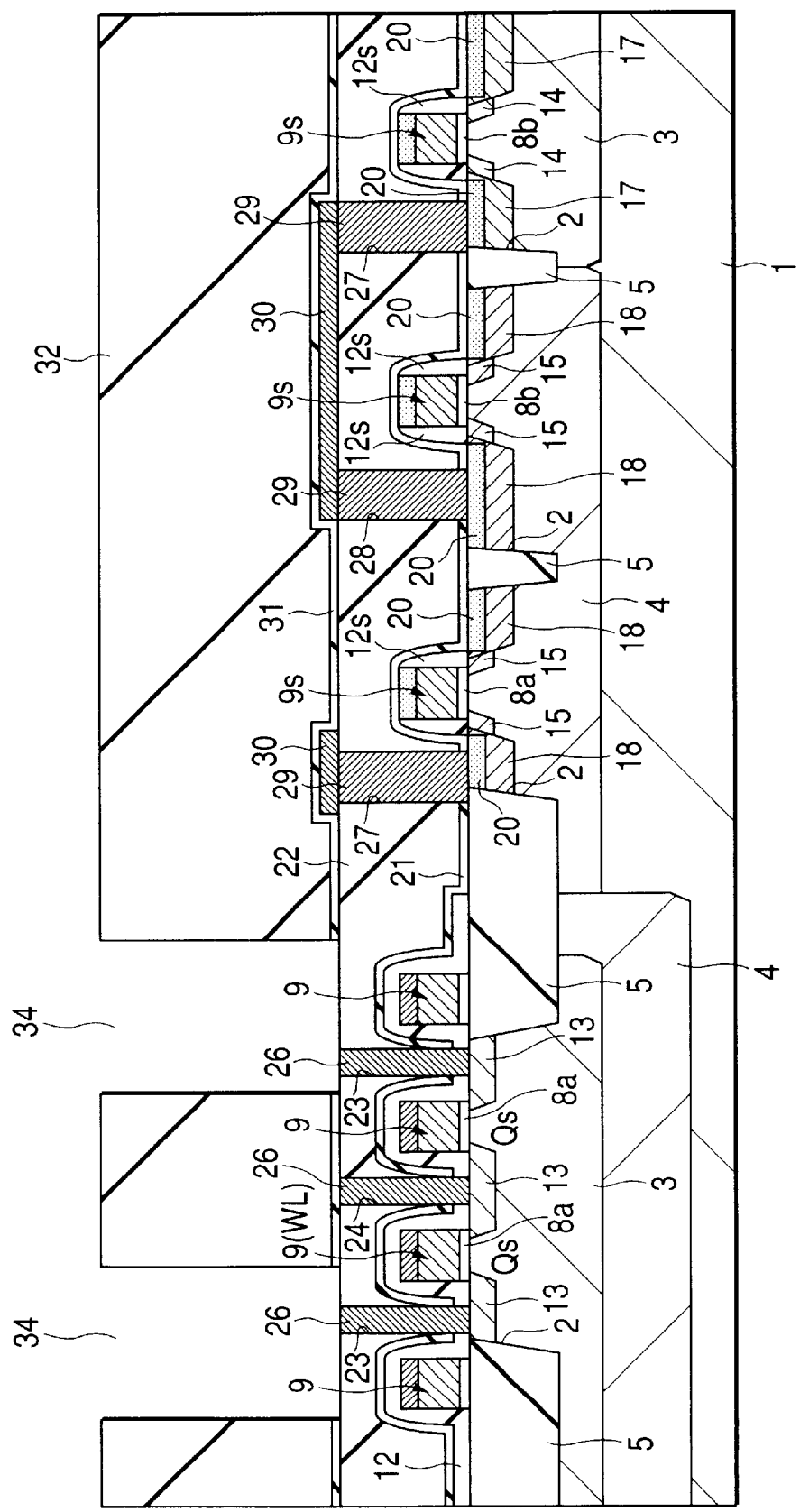
FIG. 13 is a sectional view showing the essential part of the substrate in a step subsequent to FIG. 12.

As shown in FIG. 13, a silicon oxide film 32 having a thickness of approximately 300 nm is deposited on the silicon nitride film 31 by a CVD method.

Next, the silicon oxide film 32 and the silicon nitride film 31 in the memory cell-forming region are dry etched to form a groove 34 over the plug 26.

Figure 14:
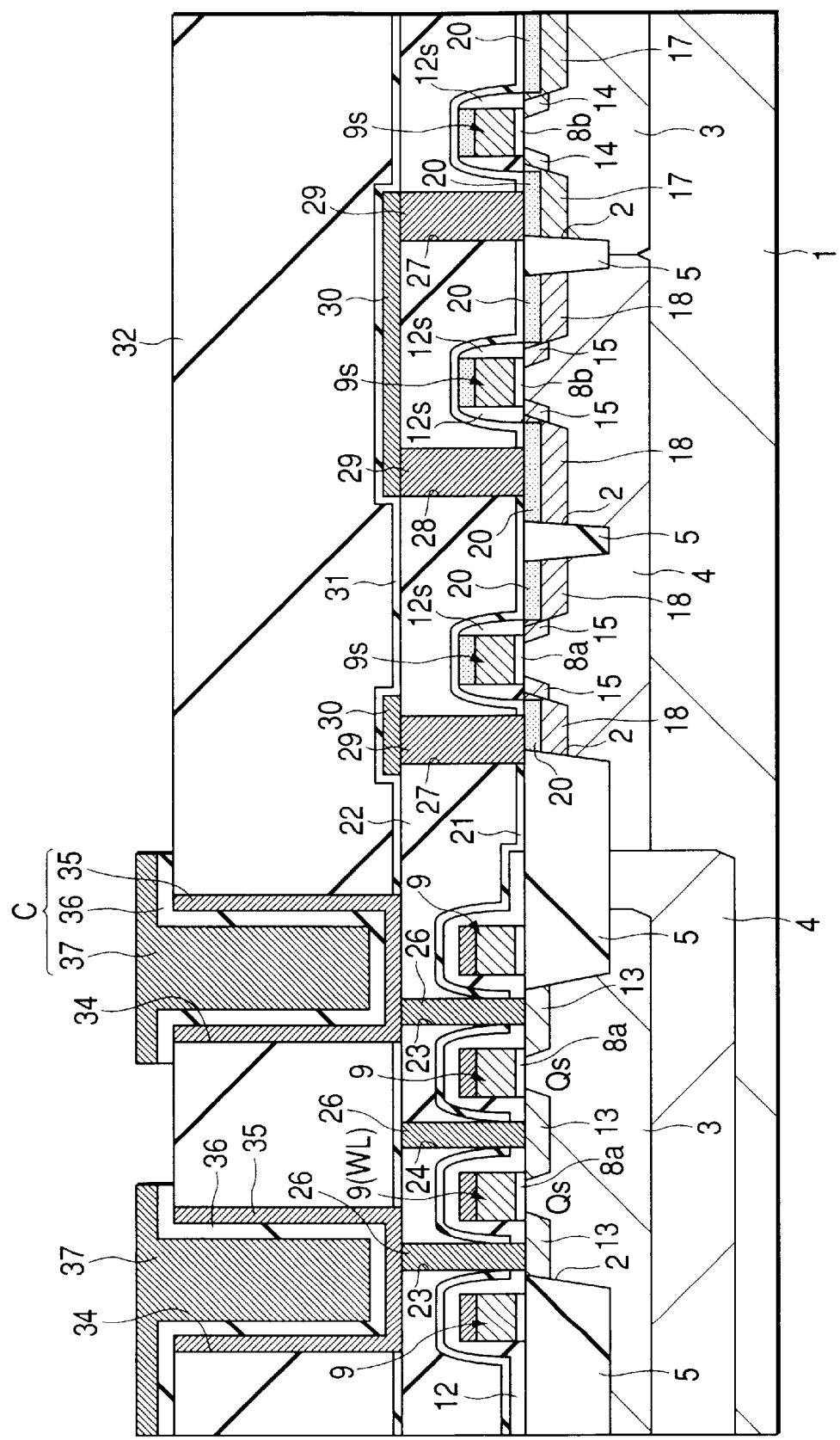
FIG. 14 is a sectional view showing the essential part of the substrate in a step subsequent to FIG. 13.

As shown in FIG. 14, a low resistance polysilicon film having a thickness of approximately 50 nm, in which an n-type impurity such as phosphorus (P) is doped, is deposited on the silicon oxide film 32 including the inside of the groove 34 by a CVD method. This low resistance polysilicon film has an irregular surface (not shown). The surface area increases owing to the irregularities, thus enabling a capacitor element C for information storage to have a high capacitance. Next, in order to increase the concentration of an impurity in the irregularities, the polysilicon film is thermally treated by subjecting to RTP in an atmosphere containing phosphorus under conditions of 700° C. to 750° C. for 1 minute.

Thereafter, a photoresist film or the like is buried in the groove 34, and the polysilicon film over the silicon oxide film 32 is etched back, thereby leaving the polysilicon film only inside the groove 34. In this way, a low electrode 35 of the capacitor element C for information storage is formed along the inner walls of the groove 34.

A capacitive insulating film 36 formed of a high dielectric film such as a silicon nitride film or a tantalum oxide ($Ta_2O_5$) film is formed over the lower electrode 35. When using a tantalum oxide film, tantalum oxide is crystallized to increase the dielectric constant, for which the film is subjected to RTP at 750° C. for 1 minute. Thereafter, an upper electrode 37 is deposited on the capacitive insulating film 36. The upper electrode 37 is formed of a low resistance polysilicon wherein an n-type impurity is doped or a TiN film. When using the TiN film, a great capacitance is obtained owing to the absence of a depletion layer. Subsequently, the capacitive insulating film 36 and the upper electrode 37 are subjected to patterning. The patterning should be carried out in such a way as to permit a plug 46 for connection between a bit line BL described hereinafter and the plug 26 not to be in contact with the upper electrode 37 and ensure a region for forming the plug 46.

According to the steps described hereinabove, there can be completed a memory cell of DRAM constituted of the MISFET Qs for information transmission and the capacitor element C for information storage connected in series with the MISFET Qs.

Figure 15:
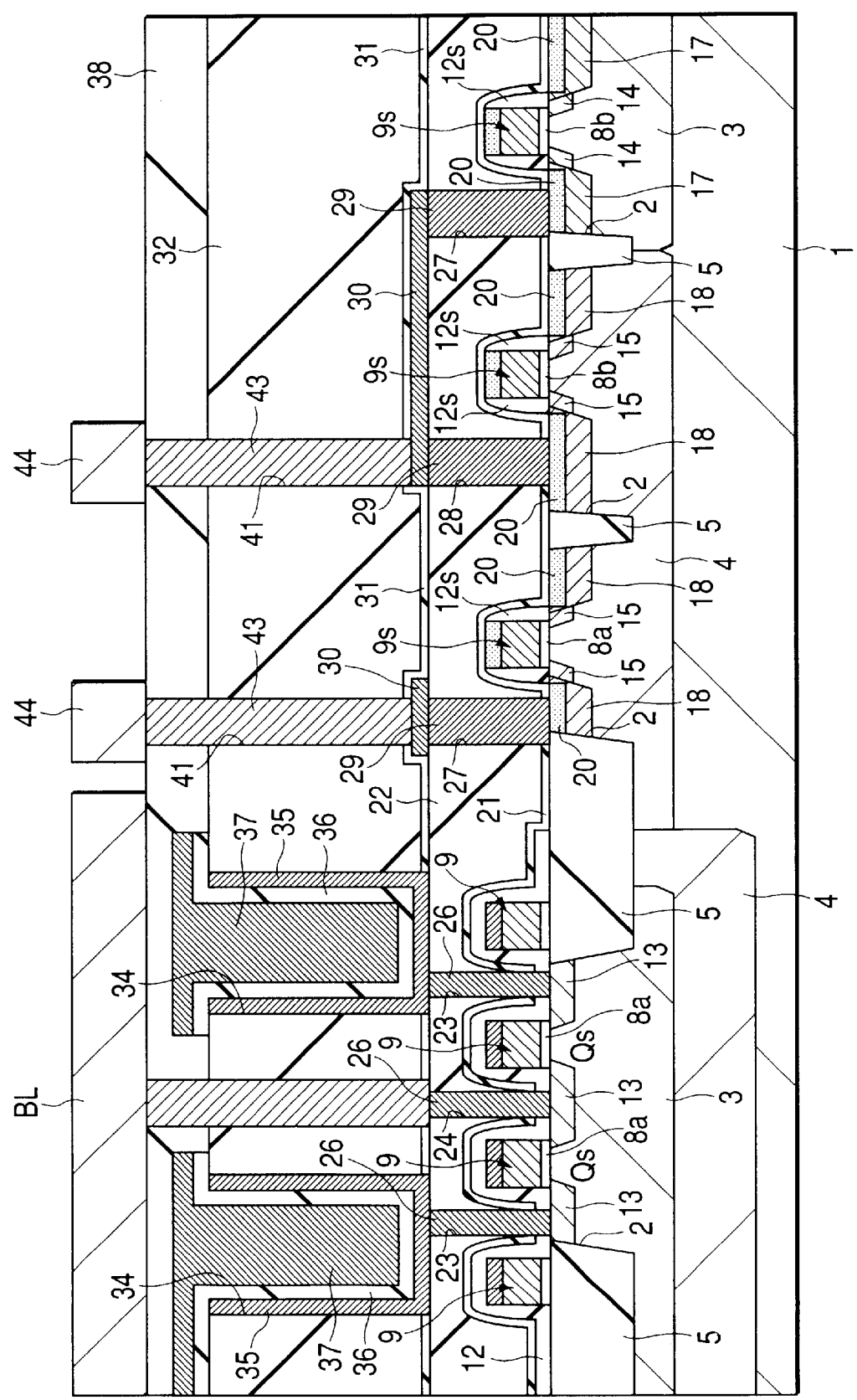
FIG. 15 is a sectional view showing the essential part of the substrate in a step subsequent to FIG. 14.

As shown in FIG. 15, a silicon oxide film 38 is deposited over the upper electrode 37 and the silicon oxide film 32 by a CVD method. Subsequently, the silicon oxide films 38, 32 are removed, by etching, from the upper portions of the plugs 26 (except for that connected with the capacitor element C for information storage) in the memory cell-forming region and also from the upper portions of the plugs 29 in the peripheral circuit-forming region, thereby forming contact holes 40, 41.

Plugs 42, 43 are, respectively, formed in the contact holes 40, 41. The plugs 42, 43 are, respectively, formed by depositing a low resistance polysilicon, in which an n-type impurity such as phosphorus (P) is doped at approximately $4 \times 10^{20}/cm^3$, over the silicon oxide film 38 including the insides of the contact holes 40, 41 by a CVD method, followed by etching back the polysilicon film (or by polishing the film by a CMP method) to leave the film only inside the contact holes 40, 41.

Figure 16:
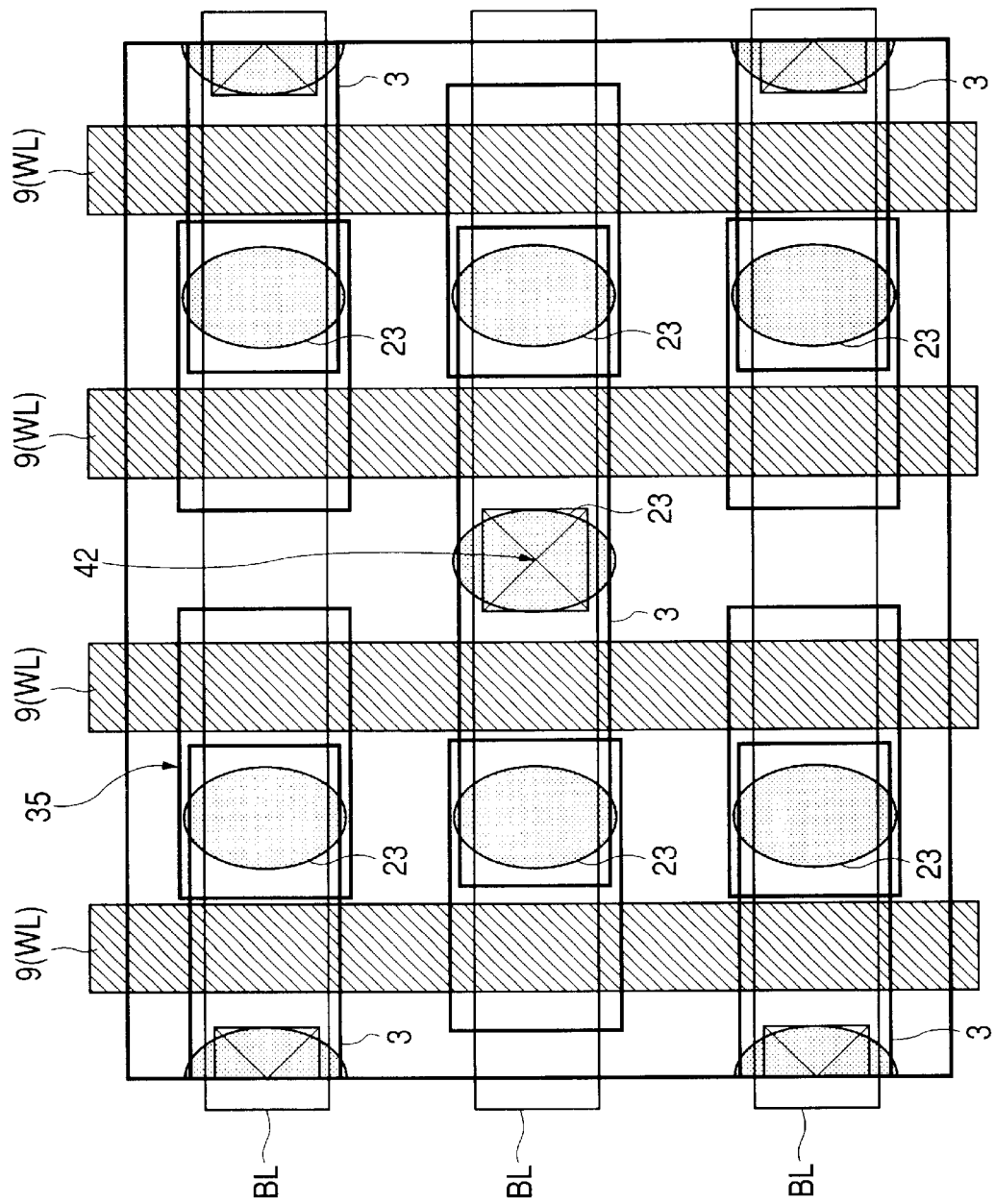
FIG. 16 is a sectional view showing the essential part of the substrate in a step subsequent to FIG. 15.

Next, a bit line BL and a second layer wiring 44 are respectively formed on the plugs 46, 42, 43. The bit line BL and the second layer wiring 44 are formed by depositing a built-up film of Ti and TiN on the silicon oxide film 38 including the plugs 46, 42, 43, further depositing an Al (aluminium) film, followed by deposition of a built-up film of Ti and TiN films on the Al film and patterning of these films. The bit line BL and the second layer wiring 44 may be formed by use of a low resistance metal such as a Cu (copper) film. FIG. 16 shows a plan view showing the peripheral circuit-forming region after the formation of the bit line BL.

Silicon oxide films and conductive films such as Al films are alternately formed over the bit line BL and the second layer wiring 44 to form a plurality of wirings. These wirings are not depicted in the figures. A passivation film made, for example, of a silicon nitride film or the like is formed on the uppermost wiring among a plurality of wirings, and holes are made in a bonding region on the uppermost wiring. According to the foregoing steps, DRAM of this embodiment is substantially completed.

It will be noted that in this embodiment, the W film 9b is used for the gate electrode 9, and other types of high melting metals such as Mo may be used therefor.

In addition, the CoSi layer 20 is used in this embodiment, and $TiSi_2$ may be used instead.

(Embodiment 2)

Although the silicon nitride film 12 is formed on the gate electrode 9 (W film 9b) in the memory cell-forming region in Embodiment 1, a silicon nitride film 201 for protection is formed on the gate electrode 9 (W film 9b), over which the silicon nitride film 12 may be formed.

A method for fabricating a semiconductor integrated circuit device according to Embodiment 2 of the invention is described in sequence of steps with reference to FIGS. 18 to 21.

As shown in FIG. 18, an element isolation 2 burying a silicon oxide film 5, a p-type well 3 and an n-type well 4 are, respectively, formed, like Embodiment 1. Next, gate oxide films 8a, 8b are formed as in Embodiment 1.

A polysilicon film 9a having a thickness of approximately 100 nm, in which any impurity is not doped, is deposited over the gate oxide films 8a, 8b by a CVD method. Subsequently, an n-type impurity (phosphorus or arsenic, or both) is ion implanted into the polysilicon film 9a over the n-type well 4 of the peripheral circuit-forming region and also in the memory cell-forming region. A p-type impurity (boron) is ion implanted into the polysilicon film 9a over the p-type well 3 of the peripheral circuit-forming region.

A W (tungsten) film 9b having a thickness of approximately 50 nm is deposited over the polysilicon 9a by a sputtering method.

Thereafter, a silicon nitride film 201 having a thickness of approximately 50 to 100 nm is deposited on the W (tungsten) film 9b by a CVD method.

The silicon nitride film 201 is etched through a mask of a photoresist film (not shown). Next, using the silicon nitride film 201 as a mask, the W film 9b and the polysilicon film 9a are dry etched to form gate electrodes 9 made of the polysilicon 9a and the W film 9b in the memory cell-forming region and the peripheral circuit-forming region. The silicon nitride film 201 for protecting each gate electrode 9 (W film 9b) is formed on the gate electrodes 9.

Like Embodiment 1, an n⁻-type semiconductor region 13 is formed in the p-type well 3 of the memory cell-forming region at both sides of the gate electrode 9, and an n⁻-type semiconductor region 14 is formed in the p-type well 3 of the peripheral circuit-forming region. Likewise, a p⁻-type semiconductor region 15 is formed in the n-type well 4.

As shown in FIG. 19, a silicon nitride film 12 having a thickness of approximately 50 nm is deposited over the semiconductor substrate 1 by a CVD method like Embodiment 1, and a side wall film 12s is formed on side walls of the gate electrode 9 in the peripheral circuit-forming region.

Next, n⁺-type semiconductor regions 17 (source, drain) are formed in the p-type well 3 of the peripheral circuit-forming region, and p⁺-type semiconductor regions 18 (source, drain) are formed in the n-type well 4.

As shown in FIG. 20, the silicon nitride film 201 of the peripheral circuit-forming region is removed by etching. In this connection, the upper portion of the side wall film 12s is also etched. Subsequently, the W film 9b of the peripheral circuit-forming region is removed by etching. For the etching, hydrofluoric acid or aqueous hydrogen peroxide is used. As a result, the polysilicon film 9a is in an exposed state in the peripheral circuit-forming region. The W film 9b in the memory cell-forming region is covered with the silicon nitride film 12 and is not etched.

Like Embodiment 1, a cobalt (Co) film 19 is deposited over the semiconductor substrate 1 by a sputtering method, under which a silification reaction is caused to proceed at the contact between the Co film and the polysilicon film 9a of the peripheral circuit-forming region and also at the contact between the Co film, and the n+-type semiconductor region 17 and the p+-type semiconductor region 18, thereby forming cobalt silicide (CoSi) layers 20. Next, an unreacted Co film 19 is removed (see FIG. 21).

Thus, like Embodiment 1, the CoSi layer 20 is formed on the polysilicon film 9a of the peripheral circuit-forming region, and the gate electrodes 9s, each made of a built-up film of the polysilicon film 9a and the CoSi layer 20, are formed in the peripheral circuit-forming region. The CoSi layer 20 is formed on the n+-type semiconductor regions 17 (source, drain) of the peripheral circuit-forming region and the p+-type semiconductor regions 18 (source, drain). The memory cell-forming region is covered with the silicon nitride film 12, and thus, no CoSi layer is formed.

Subsequent steps are similar to those of Embodiment illustrated with reference to FIGS. 9 to 16 and are not described again herein.

In this way, according to this embodiment, after the removal of the silicon nitride 201 and the W film 9b over the gate electrode 9, the CoSi layer 20 is formed. Accordingly, the contact holes 27, 28 and the like, which are formed over the source and drain (i.e. the n+-type semiconductor region 17 and the p+-type semiconductor region 18) of the n channel-type MISFET Qn1 and p channel-type MISFET Qp1 and also over the gate electrodes of these MISFET's, can be formed in high precision.

Moreover, like Embodiment 1, because the gate electrode 9 is formed by etching the built-up film of the polysilicon film 9a and the W film 9b, the microfabrication of the device or element is ensured. Because the gate electrodes 9s of the peripheral circuit-forming region are each constituted of the built-up film of the polysilicon film 9a and the CoSi layer 20, the gate electrode 9s can be made low in resistance. Moreover, because the CoSi layer 20 is formed on the n+-type semiconductor regions 17 (source, drain) and the p+-type semiconductor regions 18 (source, drain), the source and drain can be made low in resistance. In addition, the contact resistance between the plug formed on the source and drain and the source and drain can be reduced.

Because any CoSi layer 20 is not formed on the n−-type semiconductor region 13 of the memory cell-forming region, the junction leakage current can be reduced. As a result, a refresh time can be prolonged. The silicon nitride film 201 is formed on the gate electrode 9a of the memory cell-forming region, so that in case where a contact hole that extends over the gate electrode 9a is formed, the silicon nitride film 201 serves as an etching stopper, so that short-circuiting between the plug and the gate electrode 9a can be prevented, thereby improving the degree of integration of the memory cell-forming region.

(Embodiment 3)

In Embodiment 1, the gate electrodes 9 of the memory cell-forming region and the peripheral circuit-forming regions are formed by the same step and may be formed by separate steps.

FIGS. 22 to 25 are, respectively, sectional views showing a method of fabricating a semiconductor integrated circuit device according to Embodiment 3 of the invention in sequence of steps.

Figure 22:
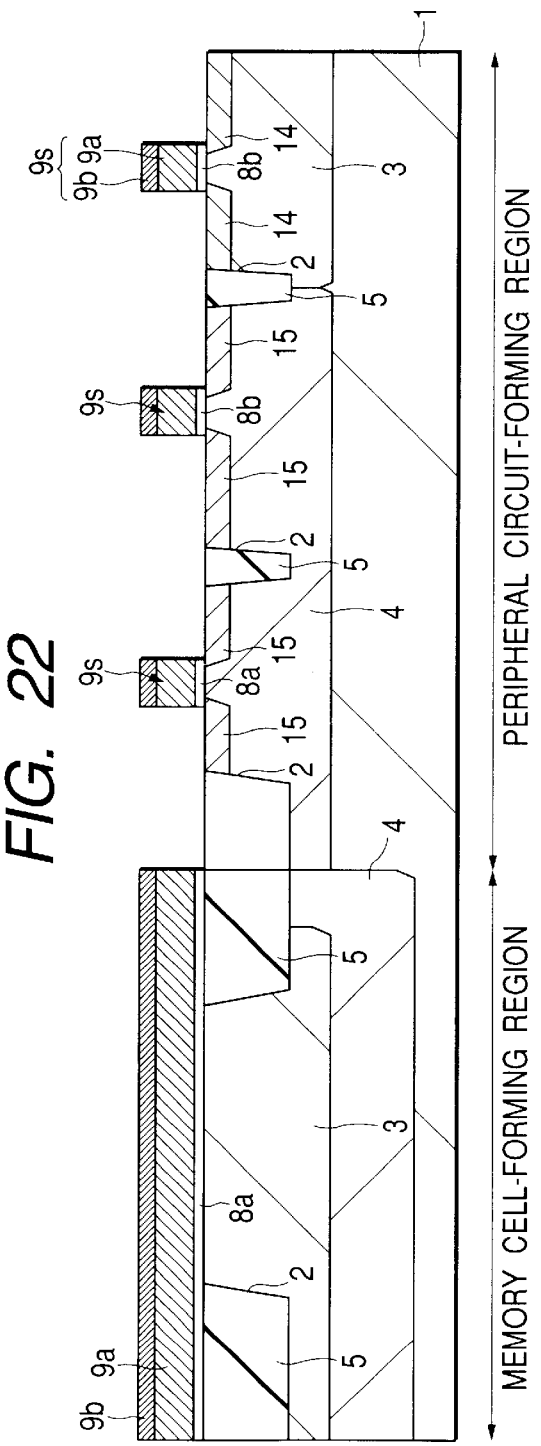
FIG. 22 is a sectional view showing an essential part of a substrate in one step of a method for fabricating a semiconductor integrated circuit device according to Embodiment 3 of the invention.

As shown in FIG. 22, like Embodiment 1, an element isolation 2 burying a silicon oxide film 5 therein, a p-type well 3 and an n-type well 4 are, respectively, formed. Next, gate oxide films 8a, 8b are formed, like Embodiment 1.

Thereafter, a polysilicon film 9a having a thickness of approximately 100 nm, in which any impurity is not doped, is deposited over the gate oxide films 8a, 8b by a CVD method. An n-type impurity (phosphorus or arsenic, or both) is ion implanted into the polysilicon film 9a over the n-type well 4 of the peripheral circuit-forming region and in the memory cell-forming region. A p-type impurity (boron) is ion implanted into the polysilicon film 9a over the p-type well 3 of the peripheral circuit-forming region. Subsequently, a W (tungsten) film 9b having a thickness of approximately 50 nm is deposited over the polysilicon film 9a by a sputtering method.

Using a photoresist film (not shown) as a mask, the W film 9b and the polysilicon film 9a are dry etched to form gate electrodes 9 of the polysilicon film 9a and the W film 9b in the peripheral circuit-forming region. At this stage, the memory cell-forming region is covered with the photoresist film.

Like Embodiment 1, an n−-type semiconductor region 14 is formed in the p-type well 3 of the peripheral circuit-forming region at both sides of the gate electrode 9, and a p−-type semiconductor region 15 is formed in the n-type well 4.

Figure 23:
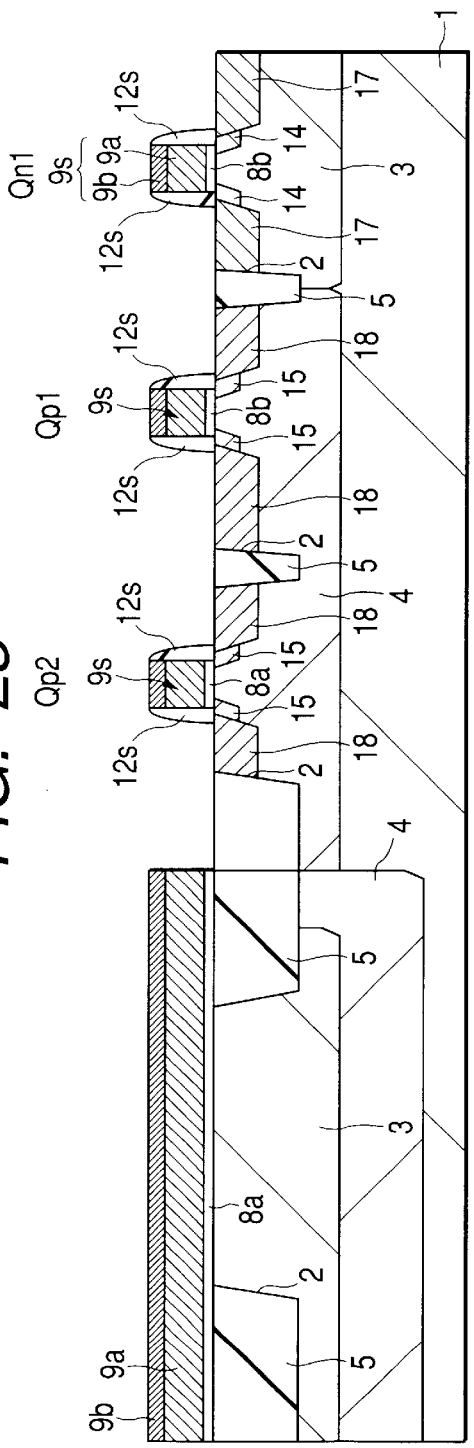
FIG. 23 is a sectional view showing the essential part of the substrate in a step subsequent to FIG. 22.

Next, like Embodiment 1, a silicon nitride film 12 having a thickness of approximately 50 nm is deposited over the semiconductor substrate 1 by a CVD method, followed formation of a side wall film 12s on the side walls of the gate electrode 9 in the peripheral circuit-forming region (FIG. 23).

n+-Type semiconductor regions 17 (source, drain) are formed in the p-type well 3 of the peripheral circuit-forming region, and p+-type semiconductor regions 18 (source, drain) are formed in the n-type well 4.

As shown in FIG. 24, the W film 9b of the peripheral circuit-forming region is removed by etching. This etching is effected by use of hydrofluoric acid or aqueous hydrogen peroxide. As a result, the polysilicon film 9a is exposed in the peripheral circuit-forming region. The W film 9b of the memory cell-forming region is covered with the silicon nitride film 12 and is not etched.

Next, like Embodiment 1, a cobalt (Co) film 19 is deposited over the semiconductor substrate 1 by a sputtering method, so that a silification reaction is caused to proceed at the contact between the Co film and the polysilicon film 9a of the peripheral circuit-forming region and also at the contact between the Co film and the n+-type semiconductor region 17 and p+-type semiconductor region 18, thereby forming a cobalt silicide (CoSi) layer 20 as shown. Next, an unreacted Co film 19 is removed. At this stage, the memory cell-forming region is covered with a photoresist film (not shown).

Accordingly, line Embodiment 1, the CoSi layer 20 is formed on the polysilicon film 9a of the peripheral circuit-forming region, thereby forming gate electrodes 9s, each made of a built-up film of the polysilicon film 9a and the CoSi layer 20, in the peripheral circuit-forming region. The CoSi layer 20 is formed on the n+-type semiconductor regions 17 (source, drain) and p-type semiconductor regions 18 (source, drain) of the peripheral circuit-forming region.

Next, using a photoresist film (not shown) as a mask, the W film 9b and the polysilicon film 9a are dry etched to form gate electrodes 9, each made of the polysilicon 9a and the W film 9b, in the memory cell-forming region.

Next, an n-type impurity (phosphorus and arsenic) is injected into the p-type well of the memory cell-forming region at both sides of the gate electrodes to form an n−-type semiconductor region 13.

A silicon nitride film 21 is deposited over the semiconductor substrate 1 by a CVD method (FIG. 25).

Subsequent steps are similar to those steps after the formation of the silicon nitride film 21 in Embodiment 1 illustrated with reference to FIGS. 9 to 16 and are not described herein.

Thus, in this embodiment, the CoSi layer 20 is formed on the gate electrode 9s, so that the contact holes 27, 28 that are formed over the source and drain (n⁺-type semiconductor region 17, p⁺-type semiconductor region 18) of the n channel-type MISFET Qn1 and p channel-type MISFET's Qp1, Qp2 and on the gate electrodes 9s of these MISFET's can be formed in high precision.

Like Embodiment 1, the gate electrode 9 is formed by etching the built-up film of the polysilicon film 9a and the W film 9b, and thus, microfabrication of an element or device is ensured. Because the gate electrode 9s of the peripheral circuit-forming region is constituted of the built-up film of the polysilicon film 9a and the CoSi layer 20, the gate electrode 9s can be made low in resistance. The CoSi layer 20 is formed on the n⁺-type semiconductor regions 17 (source, drain) and the p⁺-type semiconductor regions 18 (source, drain) of the peripheral circuit-forming region, and the source and drain can be made low in resistance. In addition, the contact resistance between the plugs formed on the source and drain, and the source and drain can be made low in resistance.

Because no CoSi layer 20 is formed on the n⁻-type semiconductor region 13 of the memory cell-forming region, the junction leakage current can be reduced. As a result, a refresh time can be prolonged.

(Embodiment 4)

In Embodiment 1, the n channel-type MISFET Qn1 and p channel-type MISFET's Qp1,Qp2 are formed in the peripheral circuit-forming region, in which other types of elements may be formed.

Figure 26:
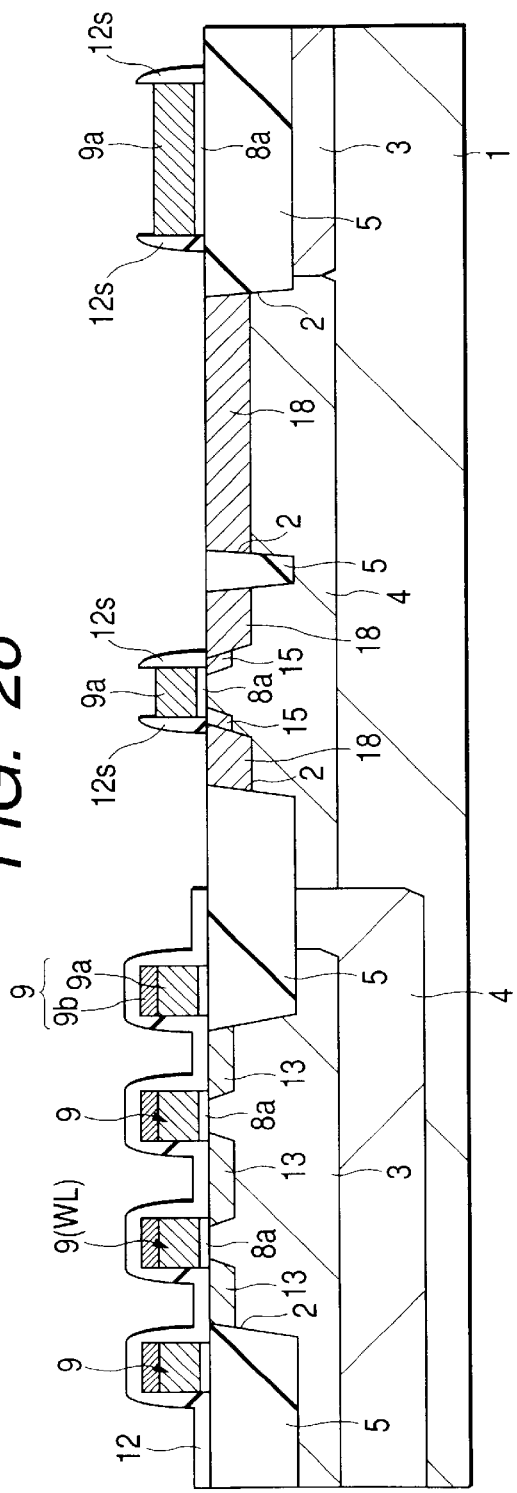
FIG. 26 is a sectional view showing an essential part of a substrate in one step of a method for fabricating a semiconductor integrated circuit device according to Embodiment 4 of the invention.
Figure 27:
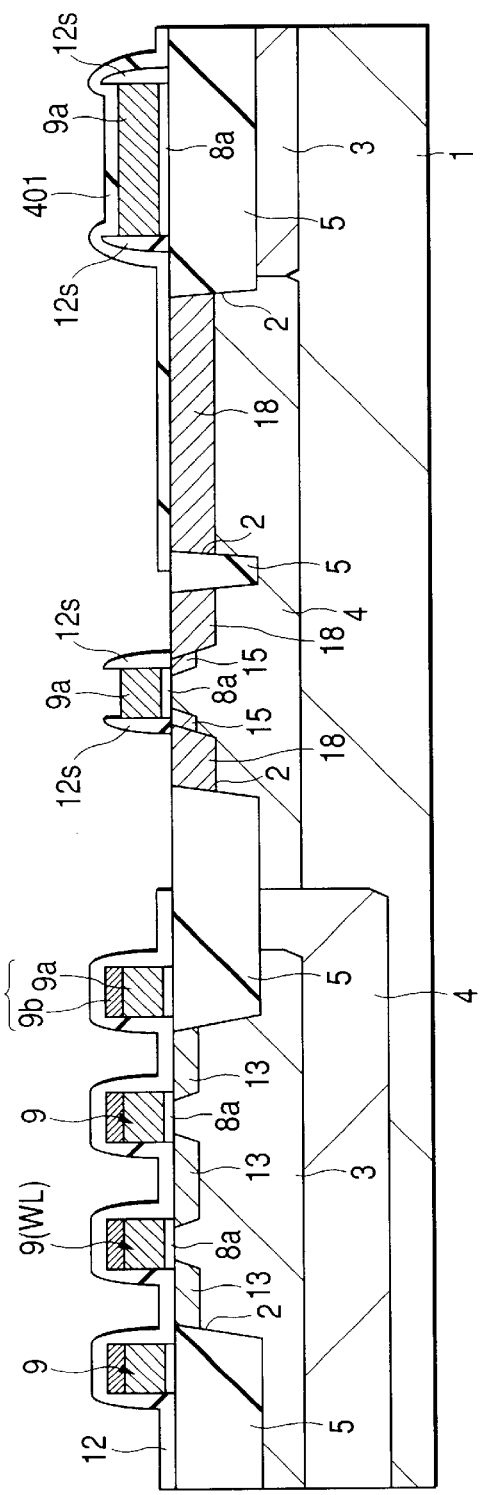
FIG. 27 is a sectional view showing the essential part of the substrate in a step subsequent to FIG. 26.
Figure 28:
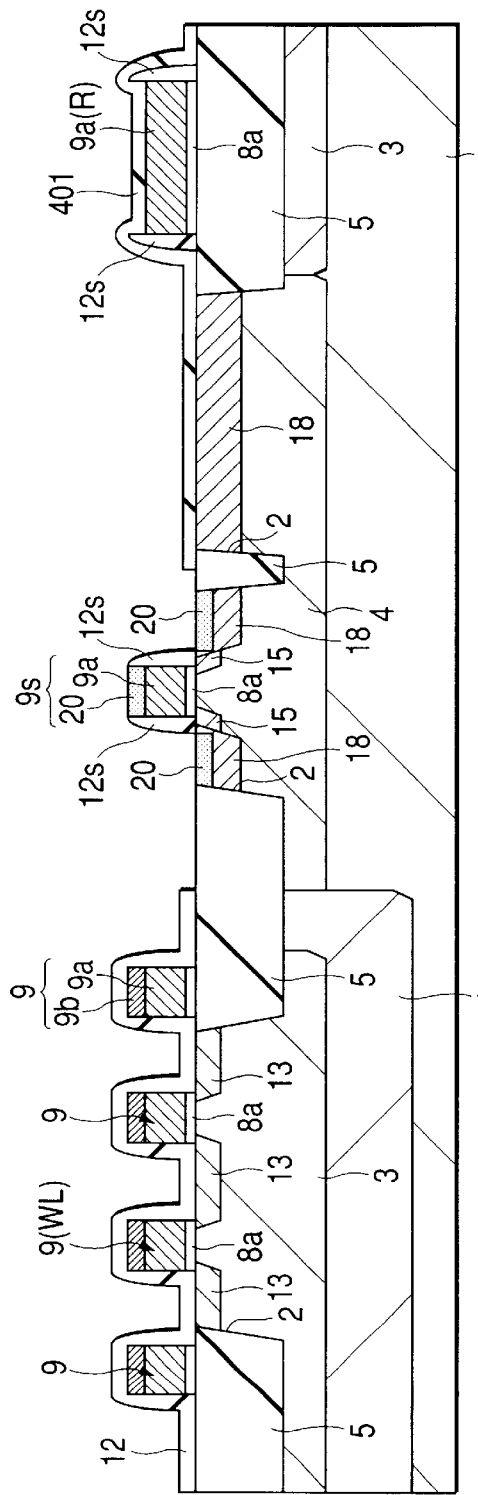
FIG. 28 is a sectional view showing the essential part of the substrate in a step subsequent to FIG. 27.

FIGS. 26 to 28 are, respectively, sectional views showing a method of fabricating a semiconductor integrated circuit device in sequence of steps according to Embodiment 4 of the invention. In this embodiment, a resistor element R is formed in the peripheral circuit-forming region.

As shown in FIG. 26, like Embodiment 1, an element isolation 2 burying a silicon oxide 5 therein, a p-type well 3 and an n-type well 4 are, respectively, formed. Next, like Embodiment 1, gate oxide films 8a, 8b (not shown) are formed.

A polysilicon film 9a having a thickness of approximately 100 nm, in which any impurity is doped, is deposited over the gate oxide films 8a, 8b by a CVD method. Subsequently, a p-type impurity (boron) is ion implanted into the polysilicon film 9a on the p-type well of the peripheral circuit-forming region and also into the polysilicon film 9a of the memory cell-forming region. Further, an n-type impurity (phosphorus or arsenic, or both) is ion implanted into the polysilicon film 9a on the n-type well 4 of the peripheral circuit-forming region and also into the polysilicon film 9a over the element isolation 2. A W (tungsten) film 9b having a thickness of approximately 50 nm is deposited over the polysilicon films 9a by a sputtering method.

Using a photoresist film (not shown) as a mask, the W film 9b and the polysilicon film 9a are dry etched to form gate electrodes 9, each made of the polysilicon film 9a and the W film 9b, in the memory cell-forming region and the peripheral circuit-forming region. At this stage, the W film 9b and the polysilicon film 9a are left on the wide element isolation region 2 of the peripheral circuit-forming region.

Next, like Embodiment 1, an n⁻-type semiconductor region 13 is formed in the p-type well 3 of the memory cell-forming region at both side of the gate electrode 9, an n⁻-type semiconductor region 14 (not shown) is formed in the p-type well 3 of the peripheral circuit-forming region, and a p⁻-type semiconductor region 15 is formed in the n-type well 4.

Like Embodiment 1, a silicon nitride film 12 having a thickness of approximately 50 nm is deposited over the semiconductor substrate 1, thereby forming side wall films 12s on the side walls of the gate electrode 9 of the peripheral circuit-forming region and the side walls of the W film 9b and the polysilicon film 9a left on the wide element isolation 2 of the peripheral circuit-forming region. At this stage, the memory cell-forming region is covered with a photoresist film (not shown).

Next, an n⁺-type semiconductor regions 17 (source, drain) are formed in the p-type well of the peripheral circuit-forming region, and a p⁺-type semiconductor regions 18 (source, drain) are formed in the n-type well 4.

The W film 9b of the peripheral circuit-forming region is removed by etching. For the etching, hydrofluoric acid or aqueous hydrogen peroxide is used. As a result, the polysilicon film 9a is in an exposed state in the peripheral circuit-forming region. The W film 9b of the memory cell-forming region is covered with the silicon nitride film 12 and is not etched.

As shown in FIG. 27, an insulating film 401 such as a silicon oxide film or the like is formed on regions other than the n channel-type MISFET Qn-forming region of the peripheral circuit-forming region. This insulating film serves to prevent the formation of a silicide layer on the polysilicon film 9a left on the wide element isolation 2 of the peripheral circuit-forming region and also on the undesirable semiconductor substrate 1.

Like Embodiment 1, a cobalt (Co) film 19 is deposited over the semiconductor substrate 1 by a sputtering, and a silification reaction is caused to occur at the contact between the Co film and the polysilicon film 9a of the peripheral circuit-forming region and also at the contact between the Co film and the p⁺-type semiconductor region 18, thereby forming a cobalt silicide (CoSi) layer 20. Thereafter, an unreacted Co film 19 is removed (FIG. 28).

According to the steps set forth above, there is formed a resistor element R made of the polysilicon film 9a on the wide element isolation 2 of the peripheral circuit-forming region. This resistor element R has a resistance value of several tens to several hundreds of $\Omega/\square$ and is usable, for example, as a resistor for preventing electrostatic breakage or a resistor of an analog/digital converter.

Like Embodiment 1, a silicon nitride film 21 (not shown) is deposited over the semiconductor substrate 1.

Subsequent steps are similar to those steps after the formation of the silicon nitride film 21 in Embodiment 1 illustrated with reference to FIGS. 9 to 16 and are not described again herein.

Thus, in this embodiment, because the CoSi layer 20 is formed on the gate electrode 9s, the contact holes formed over the source and drain (p⁺-type semiconductor regions 18) of the p channel-type MISFET Qp1 and on the gate electrode of this MISFET can be formed in high precision.

Like Embodiment 1, the gate electrode 9 is formed by etching the built-up film of the polysilicon film 9a and the W film 9b, and thus, microfabrication of an element or device is ensured. Because the gate electrode 9s of the peripheral circuit-forming region is constituted of the built-up film of the polysilicon film 9a and the CoSi layer 20, the gate electrode 9s can be made low in resistance. The CoSi layer 20 is formed on the p⁺-type semiconductor regions 18 (source, drain) of the peripheral circuit-forming region, and the source and drain can be made low in resistance. In addition, the contact resistance between the plugs formed on the source and drain, and the source and drain can be made low in resistance.

Because no CoSi layer 20 is formed on the n⁻-type semiconductor region 13 of the memory cell-forming region, the junction leakage current can be reduced. As a result, a refresh time can be prolonged.

(Embodiment 5)

Although the n channel-type MISFET Qn1 and p channel-type MISFET's Qp1, Qp2 constitute the logic circuit in the peripheral circuit-forming region in Embodiment 1, these MISFET's may be used to form a SRAM memory cell.

Figure 29:
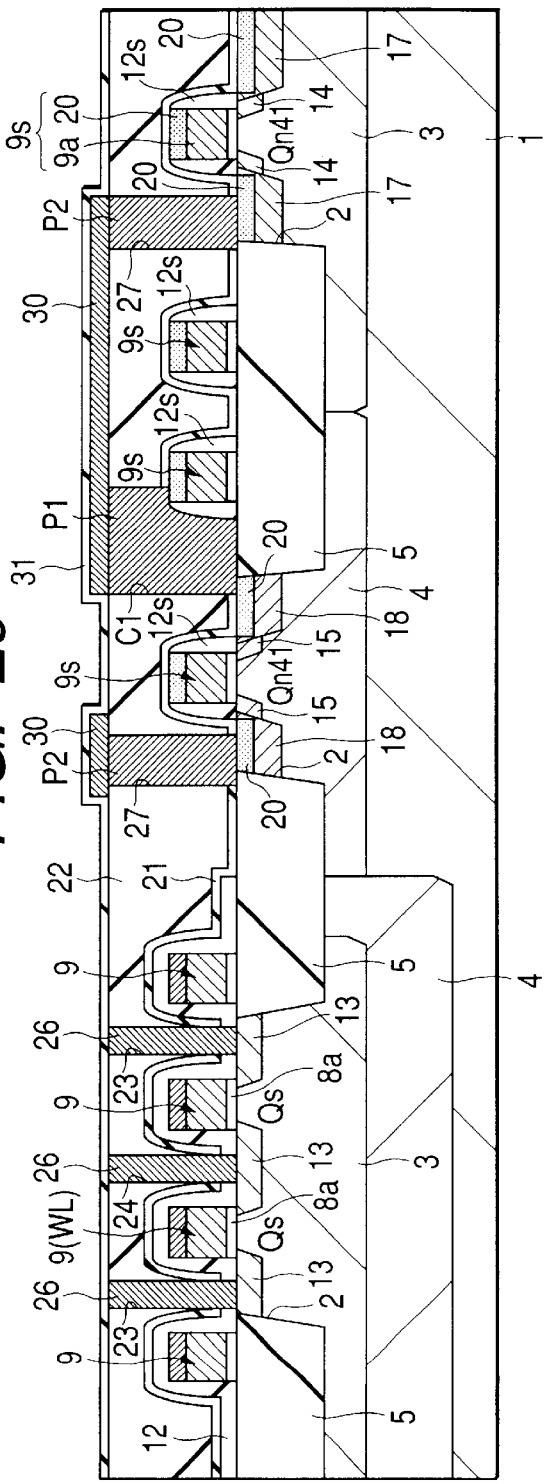
FIG. 29 is a sectional view showing an essential part of a substrate in one step of a method for fabricating a semiconductor integrated circuit device according to Embodiment 5 of the invention.

FIG. 29 is a sectional view showing a method of fabricating a semiconductor integrated circuit device according to Embodiment 5 of the invention. In this embodiment, a SRAM memory cell is formed. It will be noted that the method of fabricating a semiconductor integrated circuit device of this embodiment is similar to that of Embodiment 1 and details thereof are not described herein.

As shown in FIG. 29, an n channel-type MISFET Qn4l constituting a SRAM memory cell is formed on a p-type well 3 of the peripheral circuit-forming region, and a p channel-type MISFET Qp41 is formed on an n-type well 4. These MISFET's, respectively, have gate electrodes 9s which extend to an element isolation 2 existing between the p-type well 3 and the n-type well 4. Although not shown in the figure, gate electrodes 9s of an n channel-type MISFET Qn42 and a p channel-type MISFET Qp42, which are in face-to-face relation with these MISFET's, extend to the element isolation 2 existing between the p-type well 3 and the n-type well 4 (FIG. 30).

As shown in FIG. 29, an n channel-type MISFET Qn41 constituting an SRAM memory cell is formed on a p-type well 3 of the peripheral circuit-forming region, and a p channel-type MISFET Qp41 is formed on an n-type well 4. These MISFET's, respectively, have gate electrodes 9s which extend to an element isolation 2 existing between the p-type well 3 and the n-type well 4. Although not shown in the figure, gate electrodes 9s of an n channel-type MISFET Qn42 and a p channel-type MISFET Qp42, which are in face-to-face relation with these MISFET's, extend to the element isolation 2 existing between the p-type well 3 and the n-type well 4 (FIG. 30).

Figure 30:
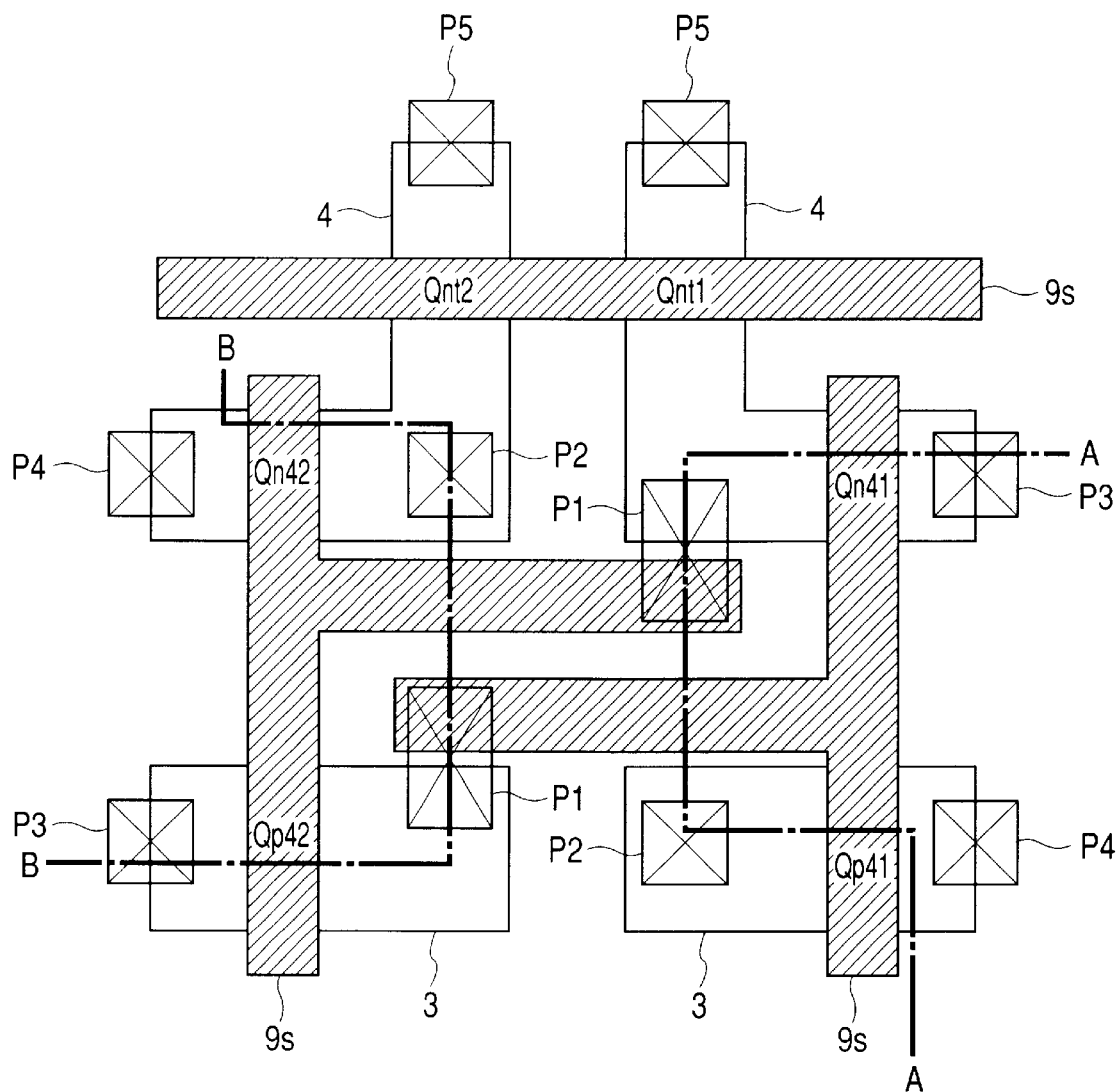
FIG. 30 is a plan view showing the essential part of the substrate formed by the method according to Embodiment 5 of the invention.

FIG. 30 is a plan view showing the peripheral circuit-forming region of the semiconductor integrated circuit device of this embodiment. FIG. 29 corresponds to a section taken along line A—A of FIG. 30.

As shown in FIG. 30, the gate electrode of the n channel-type MISFET Qn42 and an n⁺-type semiconductor region 17 of the p channel-type MISFET Qp42 are connected via a plug P1 (wiring).

A plug P2 is formed over a p⁺-type semiconductor region 18 of the p channel-type MISFET Qp41, and the plug PI and the plug P2 are connected with each other via a first layer wiring 30.

It will be noted that a sectional view taken along the line B—B of FIG. 30 is a view similar to FIG. 29. In FIG. 30, Qnt1 and Qnt2, respectively, indicate MISFET for transmission. P3, P4, and P5, respectively, indicate a plug.

It will be noted that a sectional view taken along the line B—B of FIG. 30 is a view similar to FIG. 29. In FIG. 30, Qnt1 and Qnt2, respectively, indicate MISFET for transmission. P4, P5 and P6, respectively, indicates a plug.

The SRAM memory cell of the embodiment is constituted of six MISFET's wherein a CMOS inverter is constituted of the MISFET Qn41 (for drive) and MISFET Qp41 (for load), and a CMOS inverter is constituted of MISFET Qn42 (for drive) and MISFET Qp42 (for load). Mutual input and output terminals of these pairs of CMOS inverters are cross-coupled and constitute a flip-flop circuit for use as an information memory for memorizing one-bit information. Moreover, the mutual input and output terminals of these pairs of CMOS inverters are, respectively, connected to one of the source and drain of the MISFET's Qnt1, Qnt2 for transmission.

Thus, according to this embodiment, the CoSi layer is formed on the gate electrodes 9, so that the contact holes 27, which are formed on the source and drain (i.e. the n⁺-type semiconductor region 17, p⁺-type semiconductor region 18) of the n channel-type MISFET Q41 and p channel-type MISFET Qp41 constituting SRAM, can be formed in high precision. Moreover, a contact hole C1 formed on the gate electrodes of these MISFET's can be formed in high precision. In addition, the scale down of the SRAM memory cell can be realized.

Like Embodiment 1, the gate electrode 9 is formed by etching the built-up film of the polysilicon film 9a and the W film 9b, ensuring the microfabrication of the element or device. Further, because the gate electrode 9s of the peripheral circuit-forming region is constituted of the built-up film of the polysilicon film 9a and the CoSi layer 20, the gate electrode can be made low in resistance. Because the CoSi layer 20 is formed on the n⁺-type semiconductor regions 17 (source, drain) and the p⁺-type semiconductor regions 18 (source, drain), the source and drain can be made low in resistance. In addition, the contact resistance between the plugs formed on the source and drain, and the source and drain can be made low.

Because any CoSi layer 20 is not formed on the n⁻-type semiconductor region 13 of the memory cell-forming region, the junction leakage current can be reduced. As a result, a refresh time can be prolonged.

The present invention has been particularly described based on the embodiments of the invention, which should not be construed as limiting the invention thereto. Many alterations or variations may be possible without departing from the spirit of the invention.

Especially, in Embodiment 1 and the like, A CUB (capacitor under bit-line) structure wherein the capacitor element for information storage is formed under a bit line has been adopted, and a COB (capacitor over bit-line) structure wherein a capacitor element for information storage is formed over a bit line may be used.

In Embodiment 1 and the like, the W film is used as a metal film of the polymetal structure, and a builtup structure film of a barrier metal layer such as a tungsten nitride (WN) film or the like and a metal layer such as W film may be used in place of the W film. In this case, both W film and WN film can be removed by etching with hydrofluoric acid or aqueous hydrogen peroxide, followed by the procedures of the embodiments to complete the invention.

The effects of typical embodiments of the invention are briefly summarized below.

According to the invention, since a metal silicide layer is formed on a gate electrode, there can be formed, in high precision, contact holes formed over p channel-type source and drain of an n channel-type MISFET and a p-channel-type MISFET formed in the peripheral circuit-forming region and on the gate electrodes of these MISFET's.

Because the gate electrode is formed by etching the built-up film of a silicon layer and a metal layer, the microfabrication of the element is ensured. Because the gate electrodes of the peripheral circuit-forming region are formed of the built-up film of a silicon film and a metal silicide layer, the gate electrode can be made low in resistance. The metal silicide layer is formed over the $n^+$-type semiconductor regions (source, drain) and $p^+$-type semiconductor regions (source, drain) of the peripheral circuit-forming region, the source and drain can be made low in resistance. The plugs formed on the source and drain, and the source and drain can be made low in contact resistance therebetween.

Because no metal silicide layer is formed on the $n^-$-type semiconductor regions (source, drain) of the memory cell-forming region, the junction leakage current can be made low, with the result that a refresh time can be prolonged.

What is claimed is:

1. A method for fabricating a semiconductor integrated circuit device of the type which comprises a memory cell made of a MISFET for information transmission and a capacitor element and formed in a memory cell-forming region of a semiconductor substrate, and an n channel-type MISFET and a p channel-type MISFET formed in a peripheral circuit-forming region, the method comprising the steps of:

(a) forming a gate insulating film on a semiconductor substrate;
   (b) successively forming a polysilicon film and a high melting metal film on said gate insulating film, followed by patterning in a desired form to form a gate electrode in a memory cell-forming region and in a peripheral circuit-forming region, respectively;
   (c) removing the high melting metal film from the gate electrode of said peripheral circuit-forming region; and
   (d) depositing a metal layer over said peripheral circuit-forming region, followed by thermal treatment to form a silicide film on said polysilicon film in the gate electrode and a high concentration diffusion layer of said peripheral circuit-forming region.

2. A method for fabricating a semiconductor integrated circuit device of the type which comprises a memory cell made of a MISFET for information transmission and a capacitor element and formed in a memory cell-forming region of a semiconductor substrate, and an n channel-type MISFET and a p channel-type MISFET formed in a peripheral circuit-forming region, the method comprising the steps of:

(a) forming a gate insulating film on a semiconductor substrate;
   (b) successively forming a polysilicon film and a high melting metal film on said gate insulating film, followed by patterning in a desired form to form a gate electrode in a memory cell-forming region and in a peripheral circuit-forming region, respectively;
   (c) injecting an impurity at both sides of said gate electrode to form a low concentration diffusion layer;
   (d) depositing a first insulating film on said gate electrode;
   (e) anisotropically etching said first insulating film formed in the peripheral circuit-forming region to form a side wall film on side walls of the gate electrode formed in the peripheral circuit-forming region;
   (f) injecting an impurity into the peripheral circuit-forming region using the side wall film as a mask to form a high concentration diffusion layer;
   (g) removing the high melting metal film from the gate electrode of said peripheral circuit-forming region;
   (h) depositing a metal layer over said peripheral circuit-forming region, followed by thermal treatment to form a silicide film on said polysilicon film in the gate electrode and said high concentration diffusion layer of said peripheral circuit-forming region; and
   (i) removing said metal layer remaining unreacted, and forming a second insulating film over the memory cell-forming region and the peripheral circuit-forming region.

3. The method for fabricating a semiconductor integrated circuit device according to claim 2, further comprising the steps of:

(j) depositing a third insulating film on said second insulating film and removing the second insulating film and the third insulating film so as to form a contact hole over the silicide film formed over the polysilicon film of said peripheral circuit-forming region or over the high concentration diffusion layer; and
   (k) burying a conductive film in the contact hole.

4. The method for fabricating a semiconductor integrated circuit device according to claim 3, wherein said n channel-type MISFET or said p channel-type MISFET is formed in a region surrounded by an isolation region, and said contact hole extends over said isolation region.

5. A method for fabricating a semiconductor integrated circuit device of the type which comprises a memory cell made of a MISFET for information transmission and a capacitor element and formed in a memory cell-forming region of a semiconductor substrate, and a SRAM memory cell having an n channel-type MISFET and a p channel-type MISFET formed in a peripheral circuit-forming region, the method comprising the steps of:

(a) forming a gate insulating film on a semiconductor substrate;
   (b) successively forming a polysilicon film and a high melting metal film on the gate insulating film, followed by patterning in a desired form to form a gate electrode in a memory cell-forming region and in a peripheral circuit-forming region, respectively;
   (c) injecting an impurity at both sides of the gate electrode to form a low concentration diffusion layer;
   (d) depositing a first insulating film on the gate electrode;
   (e) anisotropically etching the first insulating film formed in the peripheral circuit-forming region to form a side wall film on side walls of the gate electrode formed in the peripheral circuit-forming region;
   (f) injecting an impurity into the peripheral circuit-forming region using the side wall film as a mask to form a high concentration diffusion layer;
   (g) removing the high melting metal film from the gate electrode of the peripheral circuit-forming region;
   (h) depositing a metal layer over the peripheral circuit-forming region, followed by thermal treatment to form a silicide film on the polysilicon film in the gate electrode and also on the high concentration diffusion layer of the peripheral circuit-forming region; and
   (i) removing the metal layer remaining unreacted, and forming a second insulating film over the memory cell-forming region and the peripheral circuit-forming region.

6. The method for fabricating a semiconductor integrated circuit device according to claim 5, further comprising the steps of:

(j) depositing a third insulating film on the second insulating film and removing the second insulating film and the third insulating film so as to form a contact hole extending from the polysilicon film in the gate electrode of the p channel-type MISFET to the silicide film over the high concentration diffusion layer of the n channel-type MISFET; and (k) burying a conductive film in the contact hole to form a wiring.

7. The method for fabricating a semiconductor integrated circuit device according to claim 5, further comprising the steps of:

(j) depositing a third insulating film on the second insulating film and removing the second insulating film and the third insulating film so as to form a contact hole extending from the polysilicon film in the gate electrode of the n channel-type MISFET to the silicide film over the high concentration diffusion layer of the p channel-type MISFET; and (k) burying a conductive film in the contact hole to form a wiring.

8. A method for fabricating a semiconductor integrated circuit device of the type which comprises a memory cell made of a MISFET for information transmission and a capacitor element and formed in a memory cell-forming region of a semiconductor substrate, and an n channel-type MISFET and a p channel-type MISFET formed in a peripheral circuit-forming region, the method comprising the steps of:

(a) forming a gate insulating film on a semiconductor substrate;

(b) successively forming a polysilicon film, a high melting metal film and a silicon nitride film on said gate insulating film, followed by patterning in a desired form to form a gate electrode in the memory cell-forming region and in the peripheral circuit-forming region, respectively;

(c) injecting an impurity at both sides of said gate electrode to form a low concentration diffusion layer;

(d) depositing a first insulating film on said gate electrode;

(e) anisotropically etching said first insulating film formed in the peripheral circuit-forming region to form a side wall film on side walls of the gate electrode formed in the peripheral circuit-forming region;

(f) injecting an impurity into the peripheral circuit-forming region using the side wall film as a mask to form a high concentration diffusion layer;

(g) removing the high melting metal film and the silicon nitride film from the gate electrode of said peripheral circuit-forming region;

(h) depositing a metal layer over said peripheral circuit-forming region, followed by thermal treatment to form a silicide film on said polysilicon film in the gate electrode and also on said high concentration diffusion layer of said peripheral circuit-forming region; and (i) removing said metal layer remaining unreacted, and forming a second insulating film over the memory cell-forming region and the peripheral circuit-forming region.

9. A method for fabricating a semiconductor integrated circuit device of the type which comprises a memory cell made of a MISFET for information transmission and a capacitor element and formed in a memory cell-forming region of a semiconductor substrate, and an n channel-type MISFET and a p channel-type MISFET formed in a peripheral circuit-forming region, the method comprising the steps of:

(a) forming a gate insulating film on a semiconductor substrate;

(b) successively forming a polysilicon film and a high melting metal film on the gate insulating film;

(c) subjecting the gate insulating film, the polysilicon film and the high melting metal film over the peripheral circuit-forming region to patterning thereby forming a gate electrode in the peripheral circuit-forming region;

(d) injecting an impurity at both sides of the gate electrode of the peripheral circuit-forming region to form a low concentration diffusion layer;

(e) depositing a first insulating film on the gate electrode of the peripheral circuit-forming region;

(f) anisotropically etching the first insulating film to form a side wall film on side walls of the gate electrode of the peripheral circuit-forming region;

(g) injecting an impurity into the peripheral circuit-forming region using the side wall film as a mask to form a high concentration diffusion layer;

(h) removing the high melting metal film from the gate electrode of the peripheral circuit-forming region;

(i) depositing a metal layer over the peripheral circuit-forming region, followed by thermal treatment to form a silicide film on the polysilicon film of the gate electrode and the high concentration diffusion layer of the peripheral circuit-forming region;

(j) removing the metal layer remaining unreacted; and (k) subjecting the gate insulating film, the polysilicon film, the high melting metal film and a second insulating film formed over the memory cell-forming region to patterning to form a gate electrode in the memory cell-forming region.

* * * * *